US009117923B2

(12) United States Patent
Shim et al.

(10) Patent No.: US 9,117,923 B2
(45) Date of Patent: Aug. 25, 2015

(54) THREE-DIMENSIONAL SEMICONDUCTOR MEMORY DEVICE AND A METHOD OF FABRICATING THE SAME

(71) Applicant: SAMSUNG ELECTRONICS CO., LTD., Suwon-si, Gyeonggi-do (KR)

(72) Inventors: Sunil Shim, Seoul (KR); Jaehoon Jang, Gyeonggi-do (KR); Hansoo Kim, Gyeonggi-do (KR); Sungmin Hwang, Seoul (KR); Wonseok Cho, Gyeonggi-do (KR); Jinsoo Lim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 85 days.

(21) Appl. No.: 13/830,208

(22) Filed: Mar. 14, 2013

(65) Prior Publication Data

US 2013/0313629 A1    Nov. 28, 2013

Related U.S. Application Data

(62) Division of application No. 12/858,057, filed on Aug. 17, 2010, now Pat. No. 8,409,977.

(30) Foreign Application Priority Data

Sep. 15, 2009    (KR) .................. 10-2009-0087063

(51) Int. Cl.
*H01L 29/792*    (2006.01)
*H01L 27/115*    (2006.01)

(52) U.S. Cl.
CPC ...... *H01L 29/7926* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| 8,284,601 | B2 | 10/2012 | Son et al. |
| 8,309,405 | B2 | 11/2012 | Yang et al. |
| 8,409,977 | B2 * | 4/2013 | Shim et al. ............ 438/589 |
| 2007/0252201 | A1 | 11/2007 | Kito et al. |
| 2008/0067583 | A1 | 3/2008 | Kidoh et al. |
| 2008/0099819 | A1 | 5/2008 | Kito et al. |

(Continued)

FOREIGN PATENT DOCUMENTS

| JP | 2008072051 | 3/2008 |
| JP | 2008171838 | 7/2008 |

(Continued)

*Primary Examiner* — Seahvosh Nikmanesh
(74) *Attorney, Agent, or Firm* — F. Chau & Associates, LLC

(57) ABSTRACT

A method of forming a semiconductor memory device includes stacking a plurality of alternating first insulating layers and first sacrificial layers on a substrate to form a first multilayer structure, forming a first hole through the first multilayer structure, forming a first semiconductor pattern in the first hole, stacking a plurality of alternating second insulating layers and second sacrificial layers on the first multilayer structure to form a second multilayer structure, forming a second hole through the second multilayer structure to be aligned with the first hole, forming a second semiconductor pattern in the second hole, forming a trench to expose sidewalls of the first and second insulating layers at a side of the first and second semiconductor patterns, removing at least some portions of the first and second sacrificial layers to form a plurality of recess regions, forming an information storage layer, and forming a conductive pattern.

13 Claims, 33 Drawing Sheets

(56) References Cited

U.S. PATENT DOCUMENTS

| | | |
|---|---|---|
| 2008/0173928 A1 | 7/2008 | Arai et al. |
| 2008/0179659 A1 | 7/2008 | Enda et al. |
| 2008/0180994 A1 | 7/2008 | Katsumata et al. |
| 2008/0186771 A1 | 8/2008 | Katsumata et al. |
| 2008/0242028 A1 | 10/2008 | Mokhlesi et al. |
| 2010/0109072 A1 | 5/2010 | Kidoh et al. |
| 2010/0207195 A1 | 8/2010 | Fukuzumi et al. |
| 2011/0092033 A1 | 4/2011 | Arai et al. |
| 2011/0189853 A1 | 8/2011 | Kito et al. |

FOREIGN PATENT DOCUMENTS

| | | |
|---|---|---|
| JP | 2008171839 | 7/2008 |
| JP | 2008-186868 | 8/2008 |
| JP | 2008-192708 | 8/2008 |
| JP | 2009146954 | 7/2009 |
| JP | 2010114204 | 5/2010 |
| KR | 20080034816 | 4/2008 |
| KR | 20080058251 | 6/2008 |
| KR | 1020080070583 | 7/2008 |

\* cited by examiner

THREE-DIMENSIONAL SEMICONDUCTOR MEMORY DEVICE AND A METHOD OF FABRICATING THE SAME

CROSS-REFERENCE TO RELATED APPLICATIONS

This application is a Divisional of U.S. application Ser. No. 12/858,057, filed on Aug. 17, 2010, now U.S. Pat. No. 8,409, 977, which claims priority under 35 U.S.C. §119 to Korean Patent Application No. 10-2009-087063, filed on Sep. 15, 2009, the disclosures of which are incorporated by reference herein in their entireties.

BACKGROUND

1. Technical Field

The present inventive concept relates to a three-dimensional semiconductor memory device and a method of forming the same, and more particularly to a three-dimensional semiconductor memory device comprising a seamless information storage layer and a method of forming the same.

2. Discussion of Related Art

A three-dimensional semiconductor memory device includes memory structures stacked on top of each other. For example, in a three-dimensional semiconductor memory device, an upper multilayered structure can be formed on a lower multilayered structure. The upper multilayered structure and the lower multilayered structure include an information storage layer disposed between a conductive pattern and a semiconductor pattern. The information storage layer has a boundary surface between the upper and lower multilayered structures. Further, the semiconductor pattern has a boundary surface between the upper and lower multilayered structures.

SUMMARY

According to an exemplary embodiment, a method of forming a semiconductor memory device comprises stacking a plurality of alternating first insulating layers and first sacrificial layers on a substrate to form a first multilayer structure, forming a first hole through the first multilayer structure, forming a first semiconductor pattern in the first hole, stacking a plurality of alternating second insulating layers and second sacrificial layers on the first multilayer structure to form a second multilayer structure, forming a second hole through the second multilayer structure to be aligned with the first hole, forming a second semiconductor pattern in the second hole, forming a trench to expose sidewalls of the first and second insulating layers at a side of the first and second semiconductor patterns, removing at least some portions of the first and second sacrificial layers to form a plurality of recess regions, forming an information storage layer along surfaces of the plurality of recess regions, and forming a conductive pattern within each recess region.

The first semiconductor pattern may occupy the first hole, and the second semiconductor pattern may occupy the second hole.

The first semiconductor pattern can be disposed on a surface of the first hole, and the second semiconductor pattern can be disposed on a surface of the second hole.

The method may further comprise forming a connection pad between the first semiconductor pattern and the second semiconductor pattern.

The information storage layer can be formed in a single deposition process.

The single deposition process may comprise chemical vapor deposition (CVD) or atomic layer deposition (ALD).

A thickness of the information storage layer can be less than about half of a thickness of a recess region.

The information storage layer may comprise an oxide-nitride-oxide (ONO) layer.

The information storage layer may comprise a trap insulating layer, a floating gate electrode, conductive nano dots, a tunnel insulating layer or a blocking insulating layer.

The first and second sacrificial layers can be removed substantially at a same time.

Each recess region may extend horizontally from the trench to the first and second semiconductor patterns.

The method may further comprise filling the trench with an insulating material.

Removing the first and second sacrificial layers may comprise isotropically etching the first and second sacrificial layers.

The method may further comprise removing a residual conductive pattern disposed outside each recess region.

According to an exemplary embodiment, a method of forming a semiconductor memory device comprises stacking a plurality of alternating first insulating layers and first sacrificial layers on a substrate to form a first multilayer structure, forming a first hole and a first trench through the first multilayer structure, filling the first hole and the first trench with a sacrificial pattern, stacking a plurality of alternating second insulating layers and second sacrificial layers on the first multilayer structure to form a second multilayer structure, forming, through the second multilayer structure, a second hole exposing a top surface of the sacrificial pattern in the first hole, removing the sacrificial pattern in the first hole, forming a semiconductor pattern in the first and second holes, forming, through the second multilayer structure, a second trench exposing a top surface of the sacrificial pattern in the first trench, removing the sacrificial pattern in the first trench, removing at least some portions of the first and second sacrificial layers to form a plurality of recess regions, forming an information storage layer along surfaces of the plurality of recess regions, and forming a conductive pattern within each recess region.

The semiconductor pattern can be formed by a CVD process or an epitaxial growth process.

The semiconductor pattern can be formed to cover exposed sidewalls of the first and second holes.

The semiconductor pattern may comprise a cup shaped lower pattern and a pipe shaped upper pattern.

The first and second holes may comprise a plug type hole and the first and second trenches comprise a line type trench.

A thickness of the information storage layer is less than about half of a thickness of a recess region.

The information storage layer may comprise an oxide-nitride-oxide (ONO) layer.

The information storage layer may comprise a trap insulating layer, a floating gate electrode, conductive nano dots, a tunnel insulating layer or a blocking insulating layer.

The first and second sacrificial layers can be removed substantially at a same time.

Each recess region may extend horizontally from the first and second trenches to the semiconductor pattern.

Removing the first and second sacrificial layers may comprise isotropically etching the first and second sacrificial layers.

The method may further comprise removing a residual conductive pattern disposed outside each recess region.

The method may further comprise filling the first and second trenches with an insulating material.

According to an exemplary embodiment, a semiconductor memory device comprises a first multilayer structure disposed on a substrate, the first multilayer structure comprising a plurality of alternating first insulating layers and first conductive patterns disposed between a first channel member and an isolation member, a second multilayer structure disposed on the first multilayer structure, the second multilayer structure comprising a plurality of alternating second insulating layers and second conductive patterns disposed between a second channel member and the isolation member, and an information storage layer disposed between each first conductive pattern and the first channel member and disposed between each second conductive pattern and the second channel member.

The isolation member may taper from a top portion to a bottom portion of the isolation member such that a width of the isolation member gradually decreases.

The semiconductor memory device may further comprise a third conductive pattern surrounding a lower most portion of the isolation member.

A bottom portion of the second channel member can be disposed on a top portion of the first channel member, and a sum of heights of the first channel member and second channel member can be substantially the same as a height of the isolation member.

The first and second channel members may comprise a semiconductor pattern.

The isolation member may comprise an insulating pattern. The information storage layer may comprise an oxide-nitride-oxide (ONO) layer.

The top portion of the first channel member can be larger than a bottom portion of the first channel member.

A top portion of the second channel member can be larger than the bottom portion of the second channel member.

The bottom portion of the second channel member can be smaller than the top portion of the first channel member.

A top portion of the isolation member can be larger than a bottom portion of the isolation member.

According to an exemplary embodiment, a three-dimensional semiconductor memory device comprises a substantially planar substrate, a plurality of channel members stacked on top of each other, the channel members disposed through a plurality of conductive patterns and substantially normal to the substrate, a plurality of isolation members stacked on top of each other, the isolation members disposed through the plurality of conductive patterns and substantially normal to the substrate; and an information storage layer disposed between the channel members and the conductive patterns thereby forming an elongated memory string comprising a plurality of storage cells, wherein the isolation member comprises a tapering shape having a gradually decreasing width.

A number of stacked channel members can be greater than a number of stacked isolation members.

The plurality of channel members may comprise semiconductor patterns.

The isolation members may comprise insulating patterns.

The information storage layer may comprise an oxide-nitride-oxide (ONO) layer.

According to an exemplary embodiment, a semiconductor memory device comprises a first multilayer structure comprising a plurality of alternating first insulating layers and first conductive patterns on a substrate, a first semiconductor pattern substantially normal to the substrate disposed in the first multilayer structure, a second multilayer structure comprising a plurality of alternating second insulating layers and second conductive patterns disposed on the first multilayer structure, a second semiconductor pattern disposed in the second multilayer structure, the second semiconductor pattern substantially normal to the substrate and aligned with the first semiconductor pattern, an information storage layer disposed between each first conductive pattern and the first semiconductor pattern and between each second conductive pattern and the second semiconductor pattern thereby forming an elongated memory string comprising a plurality of storage cells, and an isolation trench formed in the first and second multilayer structures, the trench substantially normal to the substrate and substantially parallel with the first and second semiconductor patterns.

The information storage layer may comprise a seamless layer at a boundary between the first multilayer structure and the second multilayer structure.

The memory device may further comprise a connection pad disposed between the first semiconductor pattern and the second semiconductor pattern.

BRIEF DESCRIPTION OF THE DRAWINGS

Exemplary embodiments of the inventive concept can be understood in more detail from the following descriptions taken in conjunction with the accompanying drawings, in which.

DETAILED DESCRIPTION OF EXEMPLARY EMBODIMENTS

Exemplary embodiments of the inventive concept will be described below in more detail with reference to the accompanying drawings. The inventive concept may, however, be embodied in different forms and should not be construed as limited to the embodiments set forth herein.

FIGS. 1 through 6 are perspective views illustrating a method of fabricating a three-dimensional semiconductor device according to an embodiment of the inventive concept.

Figure 1:
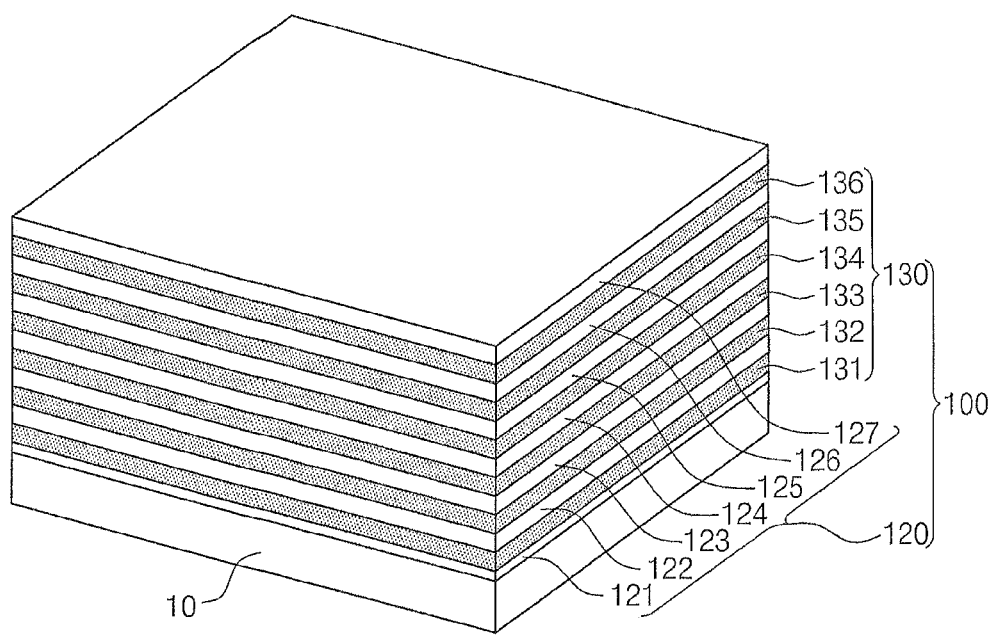
FIGS. 1 through 6 are perspective views illustrating a method of forming a three-dimensional semiconductor memory device according to an embodiment of the inventive concept.

Referring to FIG. 1, a lower multi-layered structure 100 is formed on a substrate 10. The lower multi-layered structure 100 may include a plurality of lower insulating layers 121-127 (120) and a plurality of lower sacrificial layers 131-136 (130). In an embodiment of the inventive concept, the lower insulating layer 121 disposed close to the substrate 10 is substantially thinner than the other lower insulating layers 122-127. The lower insulating layer 120 and the lower sacrificial layer 130 may be alternatingly and repeatedly stacked on top of each other as shown, for example, in FIG. 1.

According to an embodiment, the substrate 10 may be a material with semiconductor properties (e.g., silicon wafer). According to an embodiment, the substrate 10 may be an insulator (e.g., glass), semiconductor or a conductor covered with an insulator.

The lower insulating layer 120 and the lower sacrificial layer 130 may comprise different materials so that the lower insulating layer 120 and the lower sacrificial layer 130 may have an etch selectivity with respect to each other. For example, the lower insulating layer 120 may be at least one of a silicon oxide layer and a silicon nitride layer, and the lower sacrificial layer 130 may be a material layer, which is selected from the group consisting of a silicon layer, a silicon oxide layer, a silicon carbide layer and a silicon nitride layer and is different from the lower insulating layer 120.

Figure 2:
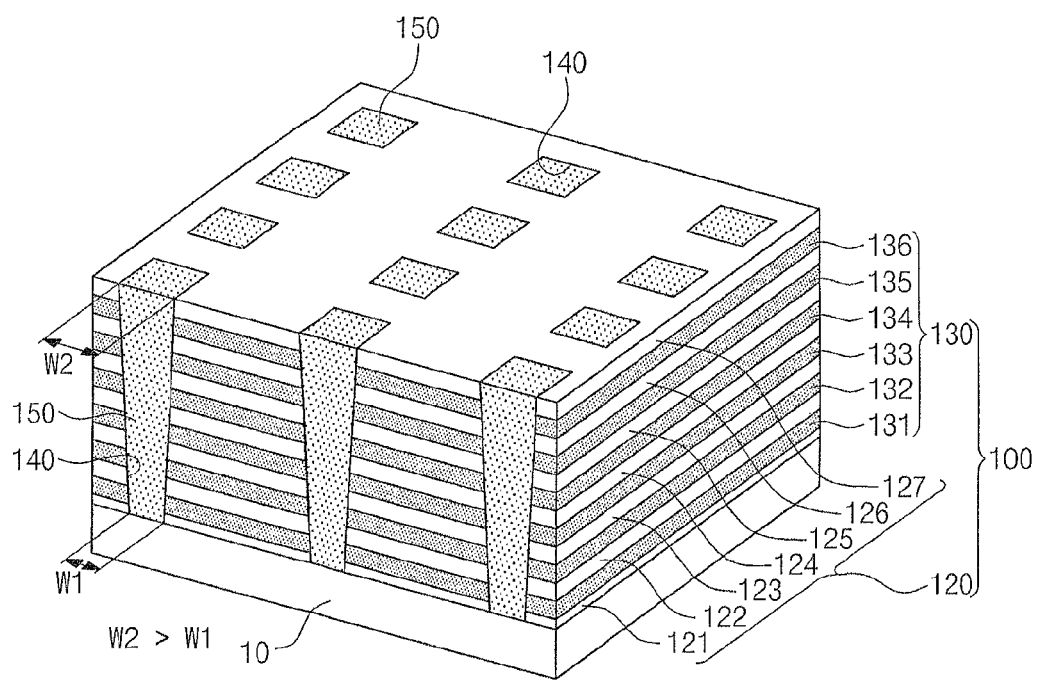

Referring to FIG. 2, lower penetrating holes 140 penetrating the lower multi-layered structure 100 are formed, and then, lower semiconductor patterns 150 filling the lower penetrating holes 140 are formed. The lower penetrating holes 140 may be arranged two-dimensionally to expose a top surface of the substrate 10. The lower semiconductor patterns 150 may be arranged two-dimensionally while directly contacting the top surface of the substrate 10.

Forming the lower penetrating holes 140 may include forming a mask pattern defining positions of the lower penetrating holes 140 on the lower multi-layered structure 100, and etching the lower multi-layered structure 100 by using the mask pattern as an etch mask. Etching the lower multi-layered structure 100 may be performed by using an anisotropic etch method. In an embodiment, since the lower multi-layered structure 100 includes a plurality of layers, the lower penetrating holes 140 may be formed with a tapered shape as shown, for example, in FIG. 2. That is, each of the lower penetrating holes 140 may be formed so that a width of the lower penetrating holes 140 is decreased from a top to a bottom.

The lower semiconductor patterns 150 may comprise a semiconductor material (e.g., silicon), and may have a crystal structure selected from the group consisting of a polycrystalline structure, a single crystalline structure and an amorphous structure. The lower semiconductor pattern 150 may have various shapes from a top view. In an embodiment, the lower semiconductor pattern 150 has a circular shape. Forming the lower semiconductor patterns 150 may include forming a lower semiconductor layer filling the lower penetrating holes 140 (hereinafter referring to as a semiconductor layer forming step) and etching the lower semiconductor layer to expose a top surface of the lower multi-layered structure 100 (hereinafter referring to as a node separating step). The semiconductor layer forming step may be performed by, for example, using an epitaxial technique or a chemical vapor deposition (CVD) technique. The node separating step may be performed by using a chemical mechanical polishing (CMP) technique or an etchback technique.

When the lower penetrating holes 140 are formed in a downwardly tapered shape, the lower semiconductor patterns 150, which are formed by using the lower penetrating holes 140 as a mold, may have also a downwardly tapered shape. That is, each of the lower semiconductor patterns 150 may be formed such that its width is decreased from a top to a bottom (i.e., $w_1 < w_2$). In an exemplary embodiment, horizontal sections of the lower penetrating holes 140 and the lower semiconductor patterns 150 may have a circular or elliptical shape unlike a rectangular shape shown in FIG. 2.

Figure 3:
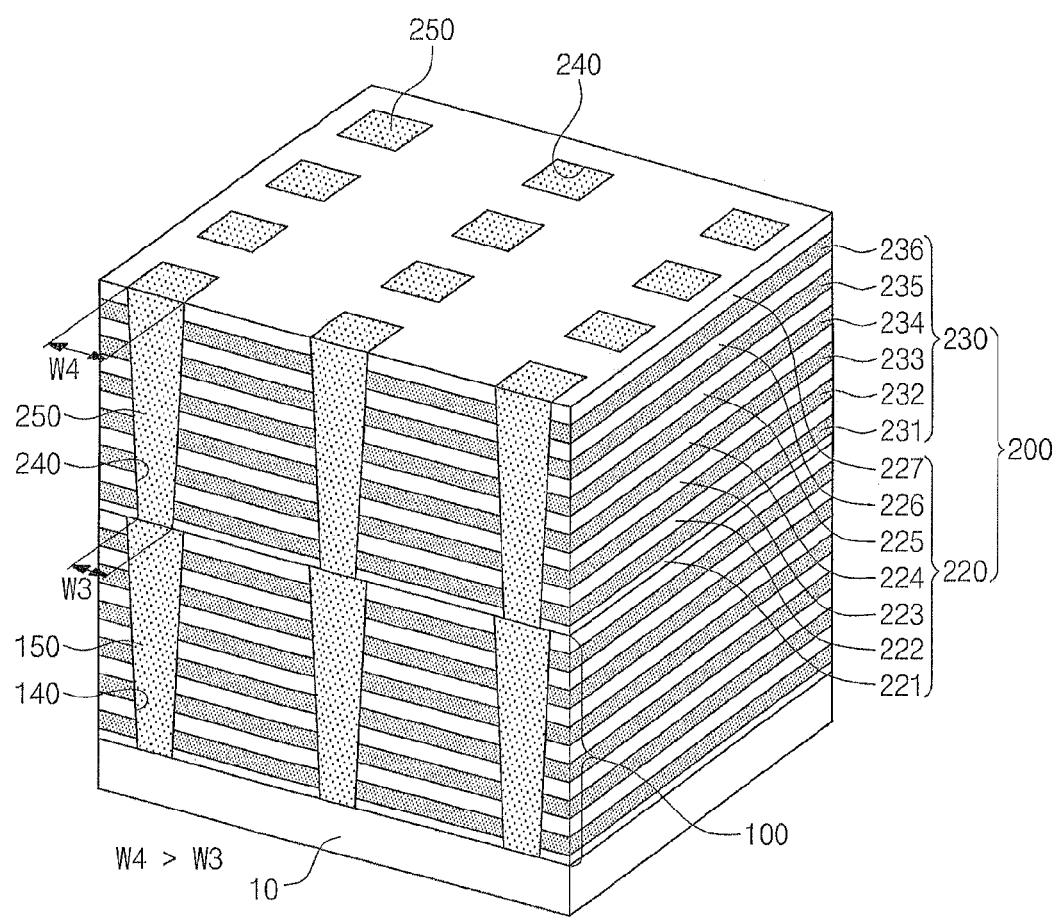

Referring to FIG. 3, an upper multi-layered structure 200 and upper semiconductor patterns 250 are formed on the lower semiconductor patterns 150.

The upper multi-layered structure 200 may include a plurality of upper insulating layers 221-227 (220) and a plurality of upper sacrificial layers 231-236 (230), and may be formed in the same manner as the lower multi-layered structure 100. That is, a material, a thickness and a forming method of the upper insulating layers 220 and the upper sacrificial layers 230 may be the same as that of the lower insulating layers 120 and the lower sacrificial layers 130, respectively. According to an embodiment, a material, a thickness and a forming method of the upper insulating layers 220 and the upper sacrificial layers 230 may be different from that of the lower insulating layers 120 and the lower sacrificial layers 130, respectively. In an embodiment, the upper multi-layered structure 200 and the lower multi-layered structure 100 may have different numbers of layers.

According to an embodiment, the upper semiconductor patterns 250 and the lower semiconductor patterns 150 may be formed by patterning processes using substantially the same photomask as an etch mask. Referring to FIGS. 2 and 3, upper penetrating holes 240 defining positions of the upper semiconductor patterns 250 may be respectively formed on the lower penetrating holes 140, and each of the upper semiconductor patterns 250 may be aligned and stacked on each of the lower semiconductor patterns 150.

In an embodiment, the upper semiconductor patterns 250 and the lower semiconductor patterns 150 may be formed by using substantially the same forming method. For example, the upper semiconductor patterns 250 may be formed by using the semiconductor layer forming step and the node separating step described with reference to FIG. 2. Accordingly, a shape, a material and a crystal structure of the upper semiconductor pattern 250 may be the same as that of the lower semiconductor pattern 150. For example, as shown in FIG. 3, the upper semiconductor patterns 250 may be formed to have a downwardly tapered shape ($w_3 < w_4$). According to an embodiment, a bottom surface of the upper semiconductor pattern 250 may have an area smaller than a top surface of the lower semiconductor pattern 150.

According to an embodiment of the inventive concept, the method may further include, prior to forming the upper multi-layered structure 200 and the upper semiconductor patterns 250, forming at least one intermediate multi-layered structure and intermediate semiconductor patterns. The intermediate multi-layered structure and intermediate semiconductor patterns may be formed by using the same method as or a modified method from the method for forming at least one of the lower and upper semiconductor patterns 150 and 250.

Figure 4:
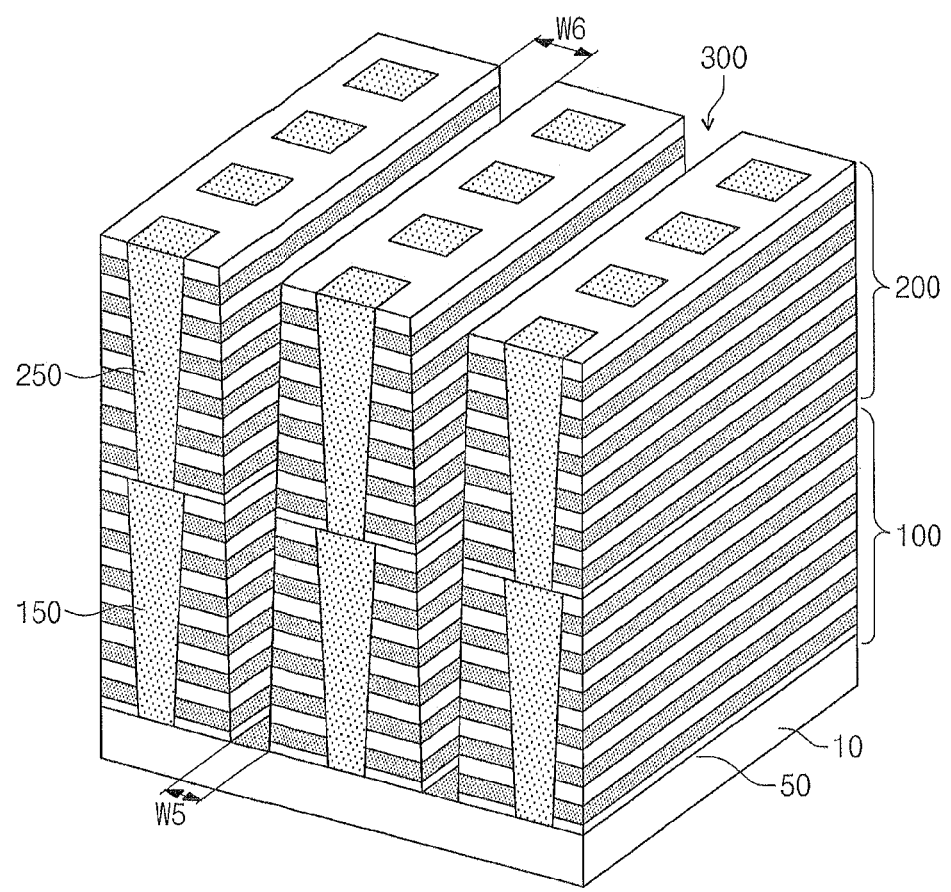

Referring to FIG. 4, trenches 300 penetrating the upper and lower multi-layered structures 100 and 200 are formed between the upper semiconductor patterns 250. The trenches 300 may be formed spaced apart from the upper and lower semiconductor patterns 150 and 250, and expose sidewalls of the upper and lower sacrificial layers 230 and 130 and sidewalls of the upper and lower insulating layers 220 and 120.

The trenches 300 may be formed through a single patterning process to penetrate a plurality of multi-layered structures (e.g., the upper and lower multi-layered structures), while the plurality of multi-layered structures are formed by using at least two separate processes. For example, as aforementioned, the method may include, prior to forming the uppermost multi-layered structure, forming penetrating holes penetrating an underlying multi-layered structure and semiconductor patterns.

In a vertical section, a width $w_6$ of an upper entrance of the trench 300 (adjacent to the top surface of the upper multi-layered structure 200) may be wider than a width of a lower entrance of the trench 300 (adjacent to the bottom surface of the lower multi-layered structure 100) (i.e., $w_5 < w_6$). That is, according to the above-described embodiment, the trench 300 is formed in a downwardly tapered shape.

According to an embodiment of the inventive concept, the trench 300 may be formed penetrating all of the layers constituting the upper multi-layered structure 200 and some of the layers constituting the lower multi-layered structure 100. For example, the trench 300 may be formed such that the trench 300 does not penetrate the lowermost layer constituting the lower multi-layered structure 100 and exposes a top surface of the lowermost layer.

Figure 5:
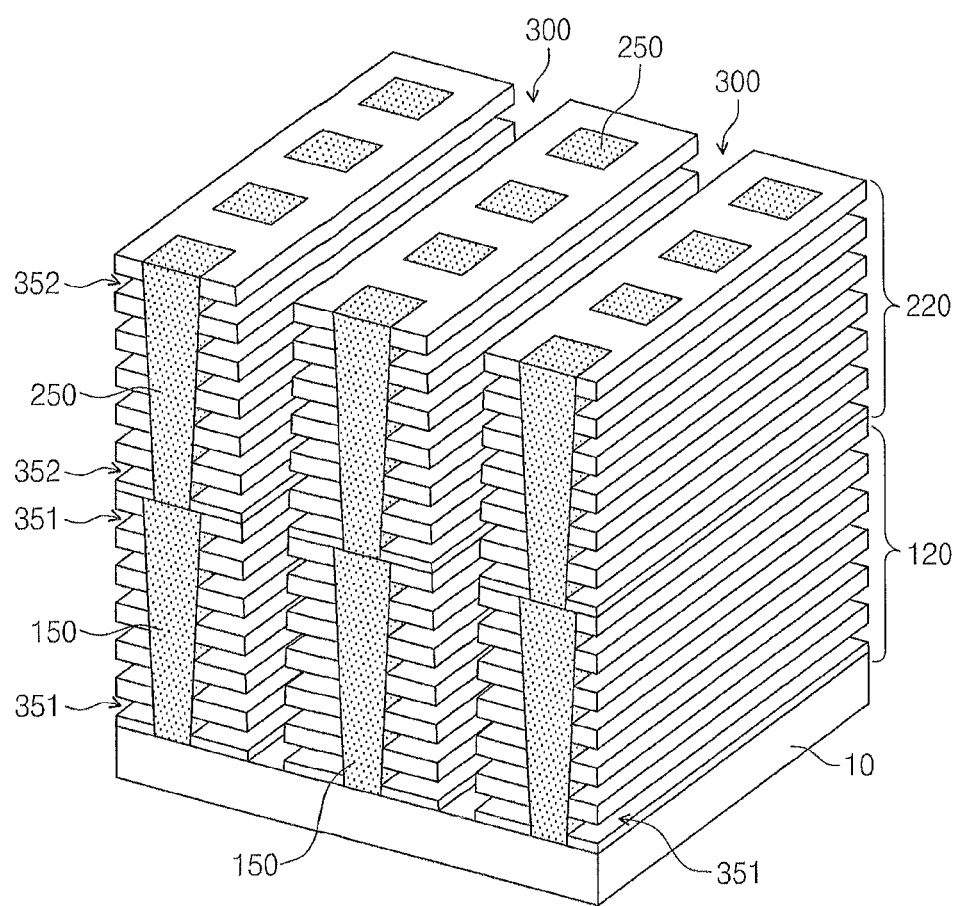

Referring to FIG. 5, the upper and lower sacrificial layers 230 and 130 whose sidewalls are exposed by the trenches 300 are selectively removed to form upper and lower recess regions 352 and 351 between the upper and lower insulating layers 220 and 210.

According to an embodiment, the upper and lower recess regions 352 and 351 may be spaces horizontally extending to the trench 300 between the upper and lower insulating layers 220 and 120, and may be formed to expose sidewalls of the upper and lower semiconductor patterns 250 and 150.

Forming the upper and lower recess regions 352 and 351 may include forming isotropically etching the upper and lower sacrificial layers 230 and 130 by using an etch recipe having an etch selectivity with respect to the upper and lower insulating layers 220 and 120. For example, when the upper and lower sacrificial layers 230 and 130 are silicon nitride layers and the upper and lower insulating layers 220 and 120 are silicon oxide layers, the etching may be performed by using an etchant including a phosphoric acid. According to an embodiment, the upper and lower recess regions 352 and 351 may be formed at substantially the same time.

Figure 6:
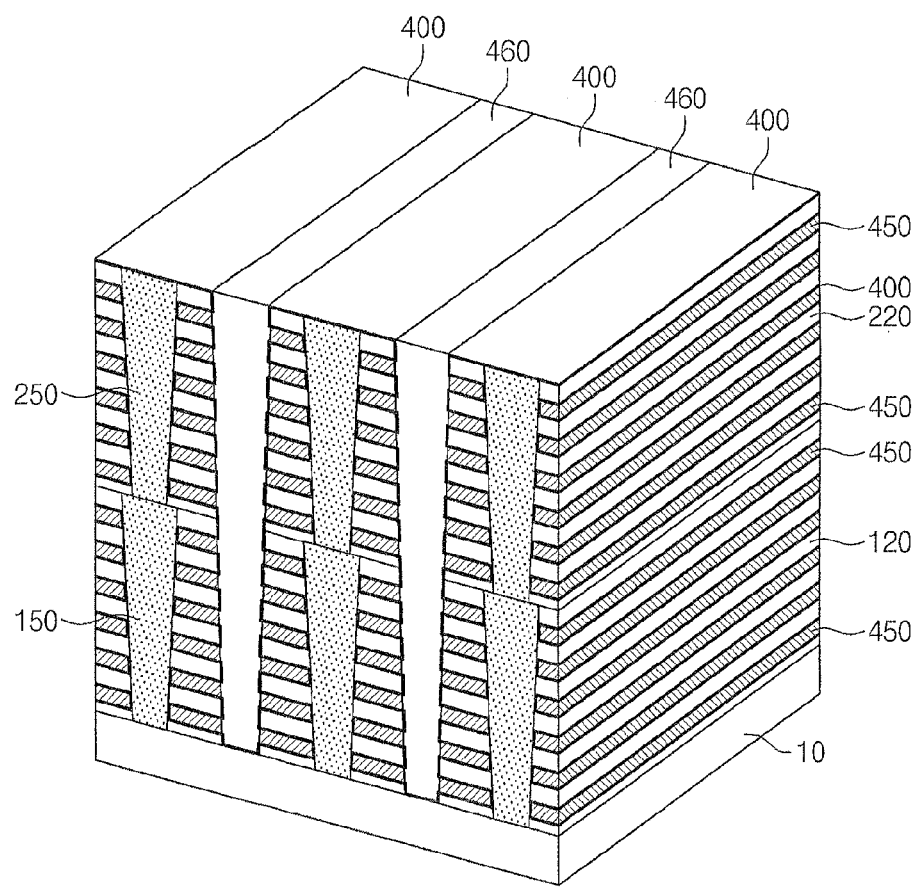

Referring to FIG. 6, an information storage layer 400 and a conductive pattern 450 are formed in each of the upper and lower recess regions 352 and 351. Forming the information storage layer 400 and the conductive pattern 450 may include forming the information storage layer 400 and a conductive layer sequentially covering the trenches 300 and the upper and lower recess regions 352 and 351, and removing the conductive layer from an inside of the trench 300 to leave the conductive patterns 450 in the upper and lower recess regions 352 and 351. Thereafter, an electrode separating pattern 460 filling the trench 300 is formed.

The information storage layer 400 may be formed by using a deposition technique (e.g., chemical vapor deposition technique or atomic layer deposition technique) that can provide superior step coverage, and may be formed at a thickness thinner than half of a thickness of the upper and lower recess regions 352 and 351. Accordingly, the information storage layer 400 may be formed to substantially conformally cover the upper and lower recess regions 352 and 351. According to an embodiment of the inventive concept, the information storage layer 400 may include a charge storage layer. For example, the information storage layer 400 may include a trap insulating layer or an insulating layer including a floating gate electrode or conductive nano dots. According to an embodiment, the information storage layer 400 may include a tunnel insulating layer and a blocking insulating layer.

The conductive layer may be formed to fill the upper and lower recess regions 352 and 351 and the trenches 300 covered with the information storage layer 400. The conductive layer may include at least one selected from the group consisting of doped silicon, tungsten (W), metal nitrides and metal silicides. In an embodiment, the information storage layer 400 and the conductive layer may be modified variously utilized by devices other than the flash memory devices in terms of material, structure or the like.

Removing the conductive layer from the inside of the trench 300 may include anisotropically etching the conductive layer by using the uppermost insulating layer 220 of the upper multi-layered structure or a mask pattern formed on the uppermost insulating layer 220 as an etch mask. When the conductive layer is removed from the inside of the trench 300, the conductive layer is vertically separated, such that the conductive patterns 450 are formed. That is, the conductive patterns 450 may be formed locally in the upper or lower recess region 352 or 351.

Forming the electrode separating pattern 460 may include filling the trench 300, from which the conductive layer is removed, with at least one insulating material. According to an embodiment, the electrode separating pattern 460 may be at least one selected from the group consisting of a silicon oxide layer, a silicon nitride layer and a silicon oxynitride layer.

According to an embodiment, since the information storage layer 400 and the conductive layer are formed on the upper and lower recess regions 352 and 351, the information storage layer 400 and the conductive patterns 450 formed in the upper recess region 352 are formed substantially at the same time as the information storage layer 400 and the conductive patterns 450 formed in the lower recess region 351. Accordingly, non-uniformity in electrical properties between electronic devices formed in the upper multi-layered structure 200 and the lower multi-layered structure 100 can be prevented.

According to an embodiment of the inventive concept, the lower conductive pattern 50 may be formed after the forming of the trench 300 described with reference to FIG. 4. For example, the lower conductive pattern 50 is formed by an ion implantation process using the upper multi-layered structure 200 as a mask. Here, the lower conductive pattern 50 is formed locally in some regions of the substrate 10 below the trench 300 as shown in FIG. 7 through FIG. 20 and thus is spaced apart from the lower semiconductor pattern 150. In an embodiment, since the trench 300 is formed in a line shape, the lower conductive pattern 50 may be also formed in a line shape.

In an embodiment, the lower conductive pattern 50 may be formed with a conductive type different from a conductive type of the substrate 10. For example, when the substrate 10 is a p-type, the lower conductive pattern 50 is an n-type. In an embodiment, the lower semiconductor pattern 150 may be different in at least one of conductive type and impurity concentration from the lower conductive pattern 50. According to an embodiment, the lowermost layer among the conductive patterns 450 may be formed to face a sidewall of the lower semiconductor pattern 150 and a top surface of the substrate 10.

Figure 7:
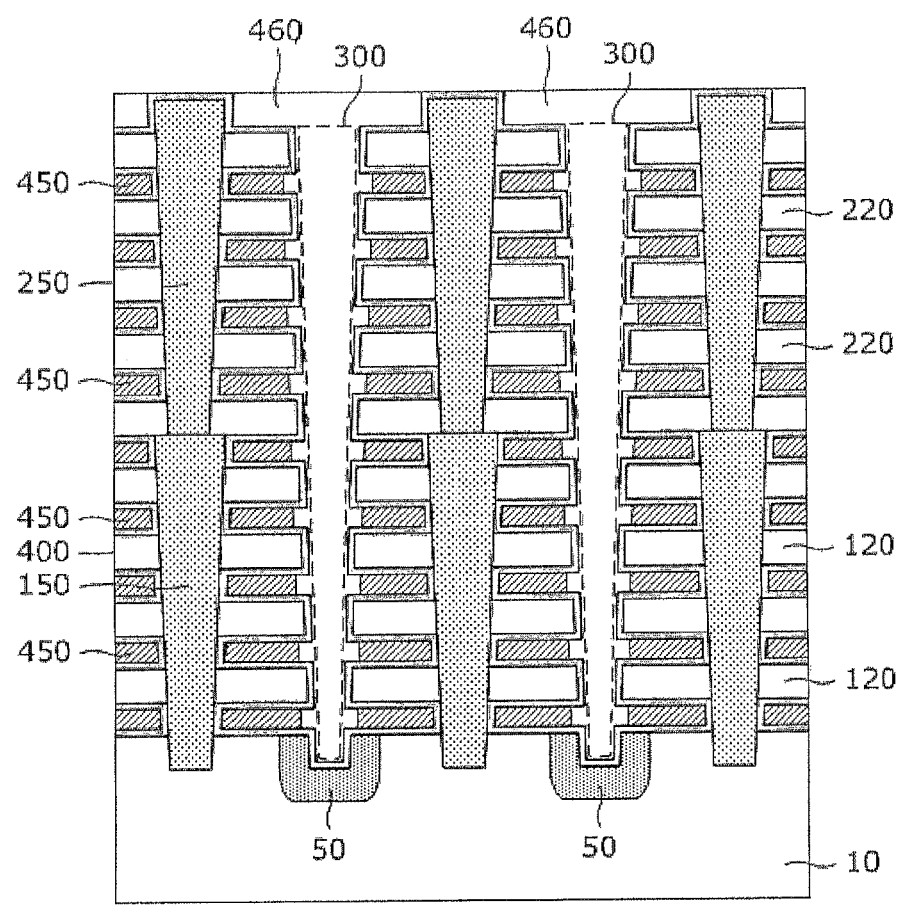
FIG. 7 is a cross-sectional view of a three-dimensional semiconductor memory device according to an embodiment of the inventive concept.

Removing the conductive layer from the inside of the trench 300, the conductive patterns 450 may be horizontally recessed to have a width less than the corresponding recess regions 352 and 351. Referring to FIG. 7, the electrode separating pattern 460 may have horizontal protrusions horizontally extending from the trench 300 to insides of the upper and lower recess regions 352 and 351.

According to an embodiment, as shown in FIG. 7 and FIG. 15 through FIG. 20, the top surface of the substrate 10 below the trenches 300 and the lower penetrating holes 140 may be recessed by a predetermined depth. For example, patterning the lower multi-layered structure 100 to form the lower penetrating holes 140 may be performed by using an over-etch process. However, due to the over-etch process, the substrate 10 may be recessed.

FIGS. 8 through 14 are perspective views illustrating a three-dimensional semiconductor memory device according to an embodiment of the inventive concept.

Figure 8:
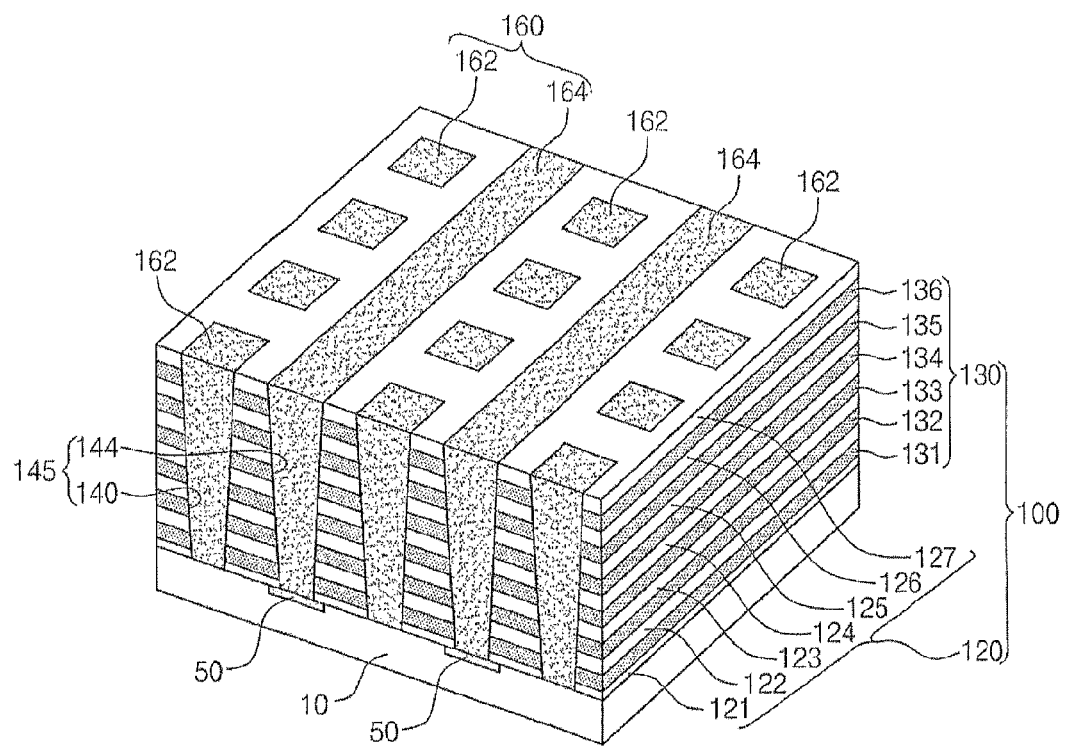
FIGS. 8 through 14 are perspective views illustrating a method of forming a three-dimensional semiconductor memory device according to an embodiment of the inventive concept.

Referring to FIG. 8, a lower multi-layered structure 100 is formed on a substrate 10, and lower sacrificial patterns 160 penetrating the lower multi-layered structure 100 are formed. The lower multi-layered structure 100 may be formed by using the same method as that of the embodiment described with reference to FIG. 1. That is, the lower multi-layered structure 100 may include a plurality of lower insulating layers 121-127 (120) and a plurality of lower sacrificial layers 131-136 (130), which are alternatingly and repeatedly stacked on top of each other. A lower conductive pattern 50 may be formed between the lower multi-layered structure 100 and the substrate 50.

Forming the lower sacrificial patterns 160 may include forming lower penetrating regions 145 penetrating the lower multi-layered structure 100 and forming the lower sacrificial patterns 160 filling the lower penetrating regions 145.

The lower penetrating regions 145 may include lower penetrating holes 140 arranged two-dimensionally on the substrate 10, and lower trenches 144 disposed in a line shape between the lower penetrating holes 140. The patterning method used for forming the lower penetrating holes 140 in the embodiment described with reference to FIG. 2 or a modified method thereof may be used as a method for forming the lower penetrating regions 145 in this embodiment. Accordingly, the lower penetrating holes 140 and the lower trenches 144 may be formed with a downwardly tapered shape, as shown, for example, in FIG. 8. According to an embodiment, the lower penetrating holes 140 and the lower trenches 144 may be respectively formed at positions where the lower semiconductor patterns 150 and the trenches 300 are formed.

Forming the lower sacrificial pattern 160 may include forming a lower sacrificial layer filling the lower penetrating regions 145, and etching the lower sacrificial layer until a top surface of the lower multi-layered structure 100 is exposed. In an embodiment, since the lower sacrificial patterns 160 are formed by using the lower penetrating regions 145 as a mold, the lower sacrificial patterns 160 may include plug-type lower patterns 162 arranged two-dimensionally on the substrate 10, and line-type lower patterns 164 disposed between the plug-type lower patterns 162.

The lower sacrificial patterns 160 may comprise a material different from layers constituting the lower multi-layered structure 100 such that the lower sacrificial patterns 160 has an etch selectivity with respect to the layers constituting the lower multi-layered structure 100. For example, the lower sacrificial patterns 160 may comprise a material layer selected from the group consisting of a silicon oxide layer, a silicon nitride layer, a silicon layer, a silicon carbide layer, metal nitride layers and metal layers but that is not used in the lower multi-layered structure 100. According to an embodiment, the lower sacrificial pattern 160 may include two or more layers. For example, the lower sacrificial layer, a first layer substantially conformally covering an inner wall of the lower penetrating region 145, and a second layer filling the lower penetrating region 145 on which the first layer is formed.

According to an embodiment, the lower penetrating holes 140 and the lower trenches 144 may be sequentially formed by using different patterning processes. In an embodiment, the plug-type lower patterns 162 and the line-type lower patterns 164 may be formed of different materials by using different processes.

Figure 9:
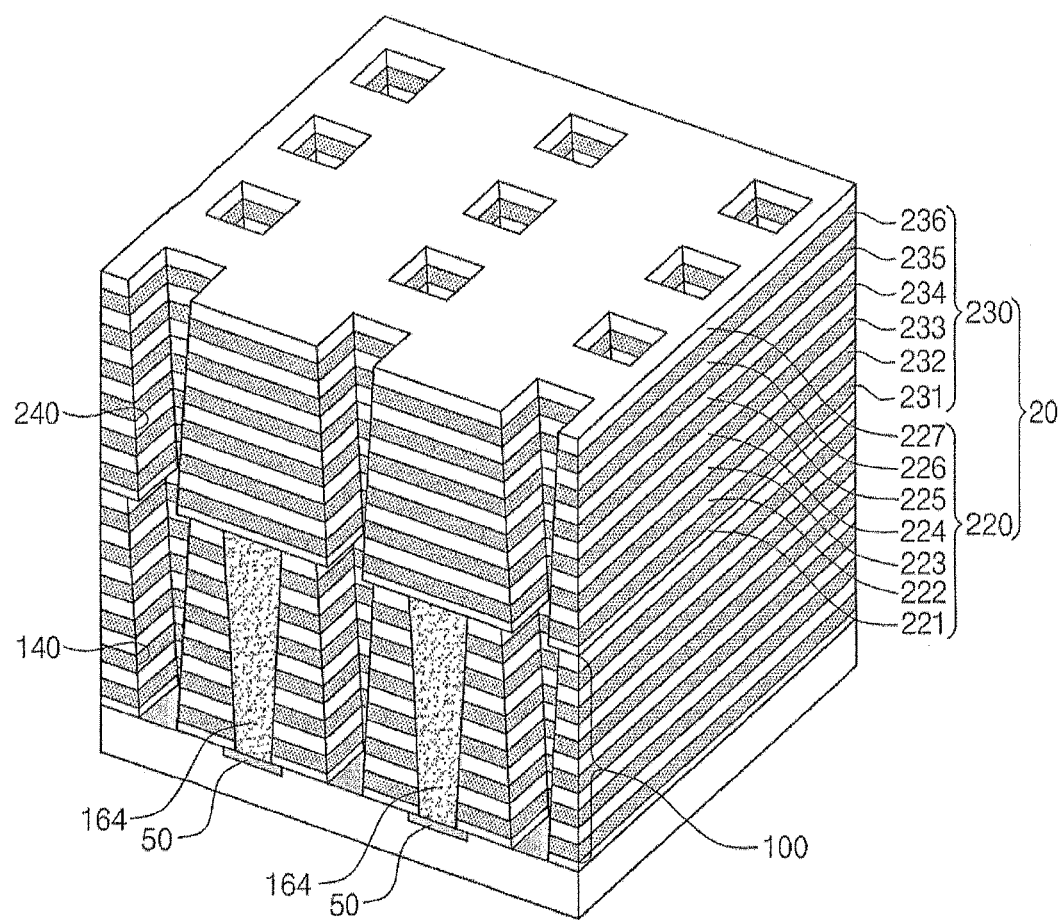

Referring to FIG. 9, an upper multi-layered structure 200 is formed on a structure 100 including the lower sacrificial patterns 160, and upper penetrating holes 240 penetrating the upper multi-layered structure 200 are formed to expose top surfaces of the plug-type lower patterns 162. Thereafter, the exposed plug-type lower patterns 162 are selectively removed to again open the lower penetrating holes 140, which expose a top surface of the lower conductive pattern 50 or a top surface of the substrate 10.

The upper multi-layered structure 200 may be formed by using the same method as that of the embodiment described with reference to FIG. 3. That is, the upper multi-layered structure 200 may include a plurality of upper insulating layers 221-227 (220) and a plurality of upper sacrificial layers 231-236 (230) alternatingly and repeatedly stacked on top of each other.

The upper penetrating holes 240 may be formed by using the same method as that of the embodiment described with reference to. FIG. 3. In an embodiment, the upper penetrating holes 240 may be formed at the same positions as the upper penetrating holes 240 of the embodiment described with reference to FIG. 3. Accordingly, the upper penetrating holes 240 may be formed to expose top surfaces of the plug-type lower patterns 162 above the plug-type lower patterns 162, and the line-type lower patterns 164 may be covered by the upper multi-layered structure 200. In an embodiment, the upper penetrating holes 240 may be formed with a downwardly tapered shape, as shown, for example, in FIG. 9.

The selective removing of the plug-type lower patterns 162 may be performed by using an etch recipe having an etch selectivity with respect to layers constituting the upper and lower multi-layered structures 200 and 100. The selective removing may be performed by using an isotropic etch method. Accordingly, the inside of the lower penetrating holes 140 penetrating the lower multi-layered structure 100 is again hollowed, so that the top surface of the lower conductive pattern 50 or the substrate 10 is exposed.

Figure 10:
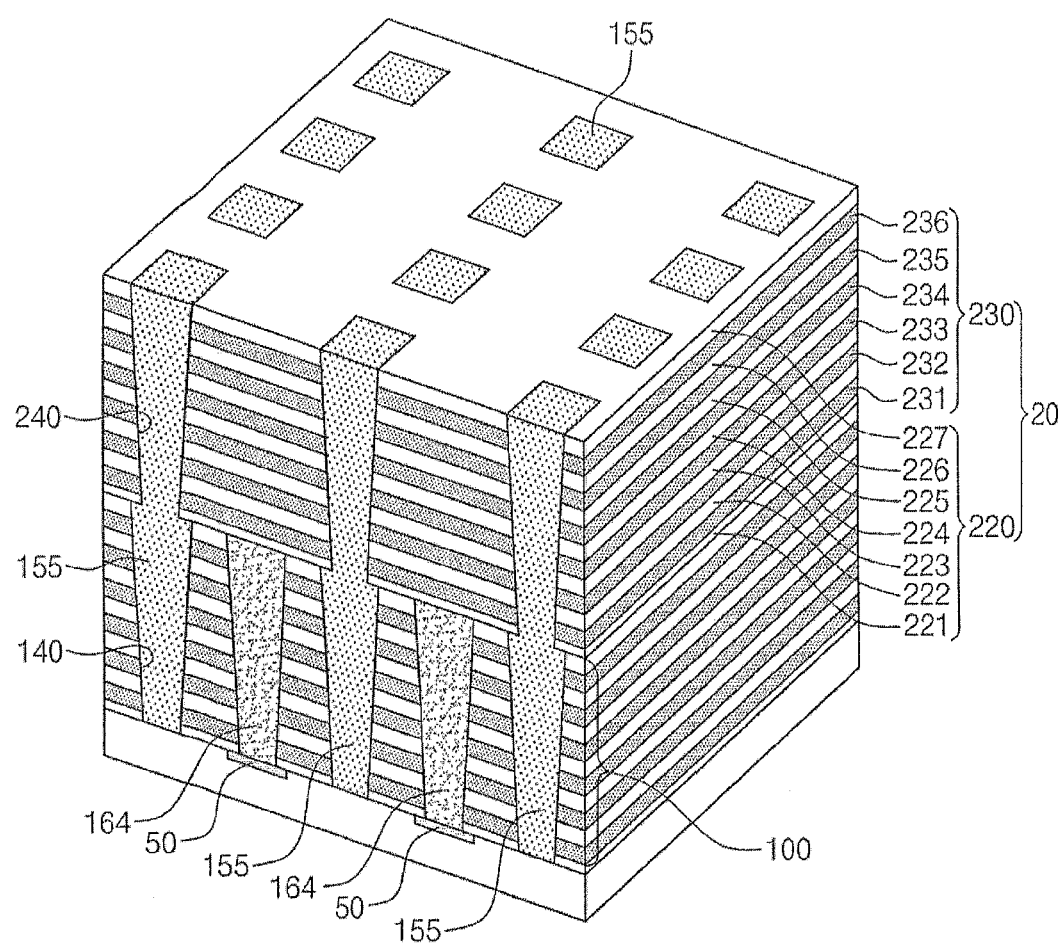

Referring to FIG. 10, semiconductor patterns 155 contacting the exposed lower conductive pattern 50 or substrate 10 are formed in the lower and upper penetrating holes 140 and 240. The semiconductor pattern 155 may be formed by using, for example, a CVD process or an epitaxial growth process.

The semiconductor pattern 155 may comprise a semiconductor material (e.g., silicon), and may have one selected from the group consisting of a polycrystalline structure, a single crystalline structure and an amorphous structure. According to an embodiment, the semiconductor pattern 155 may be formed to completely fill the lower and upper penetrating holes 140 and 240 as shown in FIG. 10.

Figure 15:
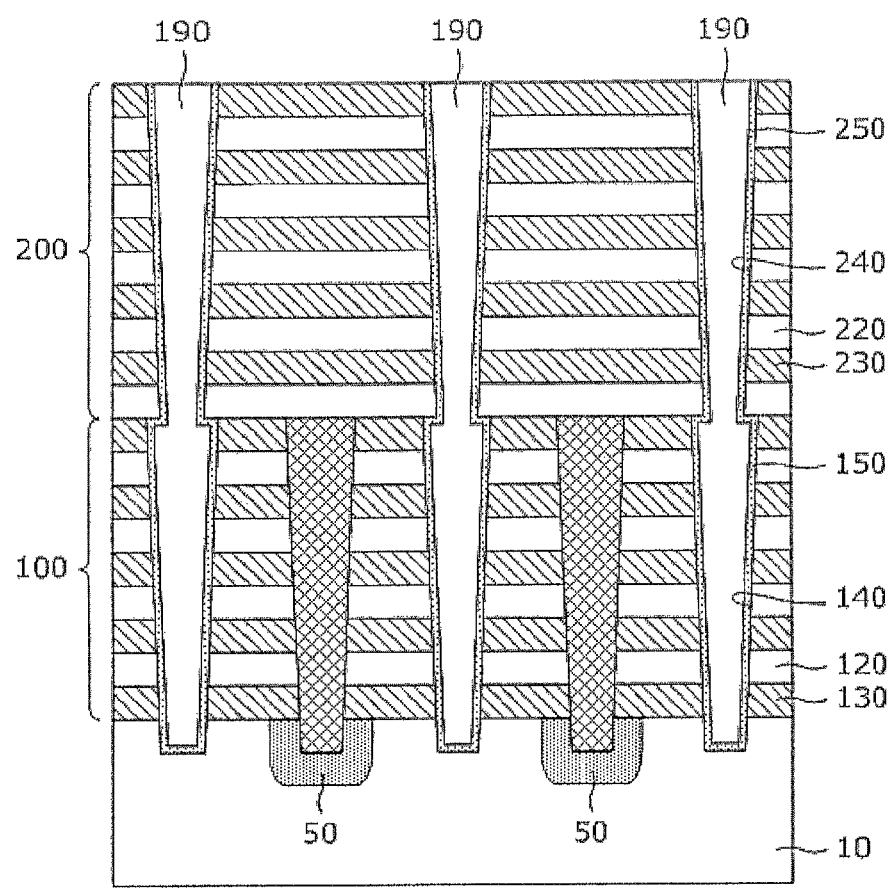
FIG. 15 is a cross-sectional view of a three-dimensional semiconductor memory device according to an embodiment of the inventive concept.
Figure 24:
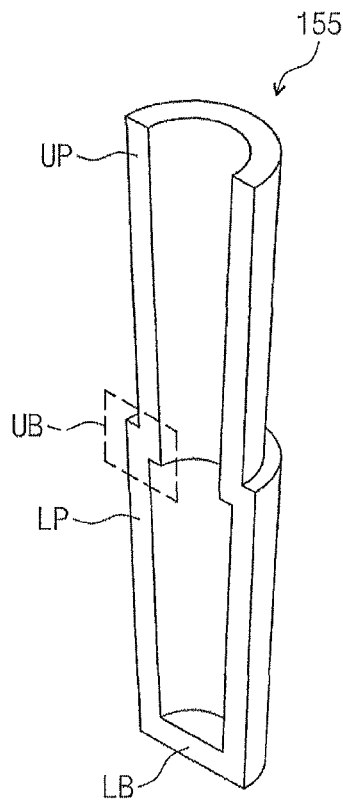
FIG. 24 is a perspective view illustrating a semiconductor pattern formed according to an embodiment of the inventive concept.

According to an embodiment, as shown in FIG. 15, the semiconductor pattern 155 may be formed to substantially conformally cover inner walls of the lower and upper penetrating holes 140 and 240. In an embodiment, the semiconductor pattern 155 may include a cup-shaped lower semiconductor pattern and a pipe-shaped upper semiconductor pattern. For example, as shown in FIG. 24, the lower semiconductor pattern may include a pipe-shaped lower sidewall portion LP and a plate-shaped bottom portion LB closing a bottom entrance thereof, and the upper semiconductor pattern may include a pipe-shaped upper sidewall portion UP and a ring-shaped bottom portion UB continuously extending from a bottom entrance of the upper sidewall portion UP to an upper entrance of the lower sidewall portion LP.

In an embodiment shown in FIG. 15, the lower and upper penetrating holes 140 and 240 in which the semiconductor pattern 155 is formed may be filled with a buried insulating layer 190. According to an embodiment, the semiconductor pattern 155 may be a polycrystalline silicon layer formed by using a CVD technique, and may have a thickness ranging from about 1 nm to about 100 nm. In an embodiment, after the semiconductor pattern 155 is formed, a process of treating the semiconductor pattern 155 using, for example, hydrogen or heavy hydrogen may be performed. Crystal defects generated in the semiconductor pattern 155 may be cured by hydrogen or heavy hydrogen atoms.

Each of the semiconductor patterns 155 may be divided into an upper semiconductor pattern disposed in the upper penetrating hole 240, and a lower semiconductor pattern disposed in the lower penetrating hole 140. That is, the upper semiconductor pattern and the lower semiconductor pattern are formed by using the upper and lower penetrating holes 240 and 140 as molds, respectively. In an embodiment, since each of the upper and lower penetrating holes 240 and 140 may be formed in a downwardly tapered shape, each of the upper and lower semiconductor patterns may be also formed in a downwardly tapered shape. In an embodiment, the upper and lower semiconductor patterns are formed substantially at the same time by using the same process. Accordingly, the upper and lower semiconductor patterns may constitute a continuous single body.

Figure 11:
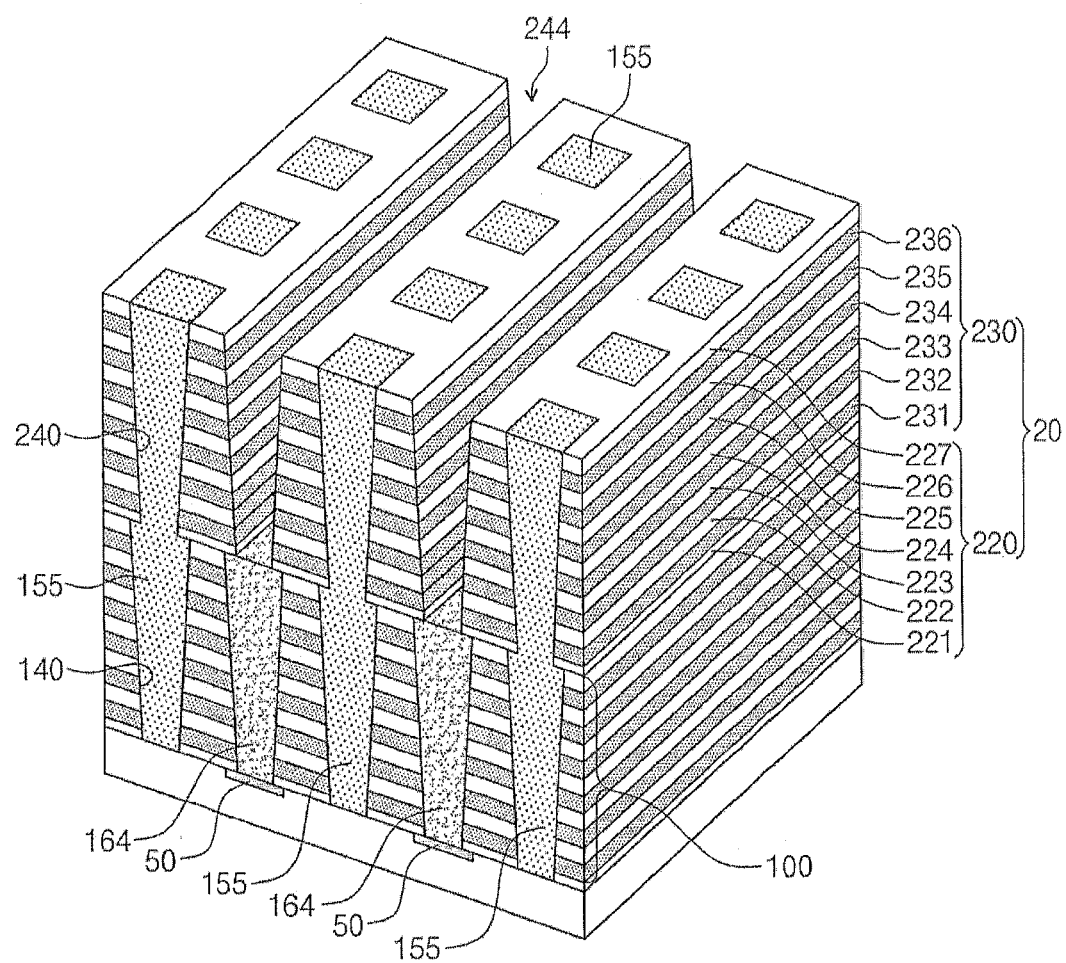
Figure 12:
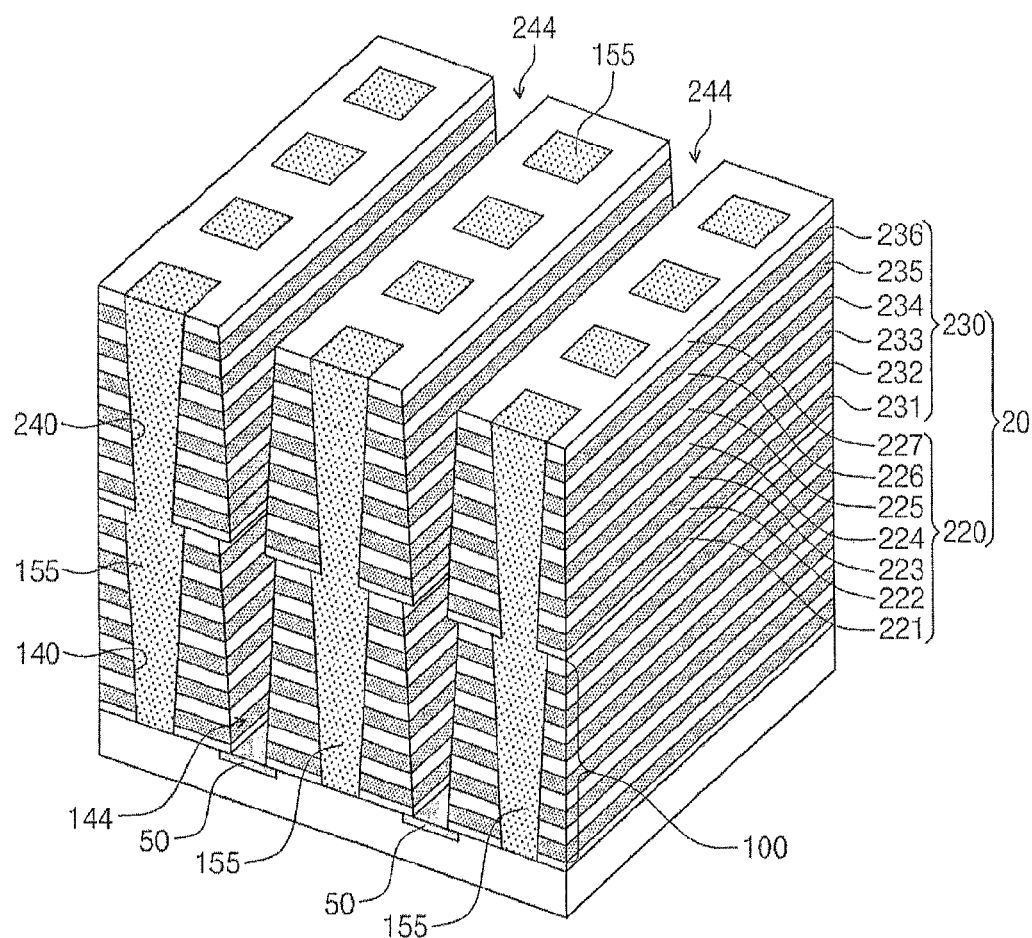

Upper trenches 244 penetrating the upper multi-layered structure 200 are formed to expose top surfaces of the line-type lower patterns 164 as shown, for example in FIG. 11. Thereafter, the exposed line-type lower patterns 164 are selectively removed to again open the lower trenches 144 as shown in FIG. 12.

Forming the upper trenches 244 may include patterning the upper multi-layered structure 200 by using a predetermined mask pattern. The mask pattern may be disposed on the semiconductor patterns 155 while having openings formed on the line-type lower patterns 164. The patterning of the upper multi-layered structure 200 may be performed by using the etch method described with reference to FIGS. 3 through 9. For example, an anisotropic etch method may be used for forming the trenches 244. In an embodiment, since the upper multi-layered structure 200 includes a plurality of thin layers, the upper trenches 244 may be formed in a downwardly tapered shape. That is, each of the upper trenches 244 may be formed such that a width of the upper trenches is decreased from a top to a bottom.

The selective removing of the line-typed lower patterns may include isotropically etching the line-type lower patterns 164 by using an etch recipe having an etch selectivity with respect to layers constituting the upper and lower multi-layered structures 200 and 100. The upper trench 244 and the again opened lower trench 144 have a downwardly tapered shape and expose inner sidewalls of the upper and lower multi-layered structures 200 and 100.

Figure 13:
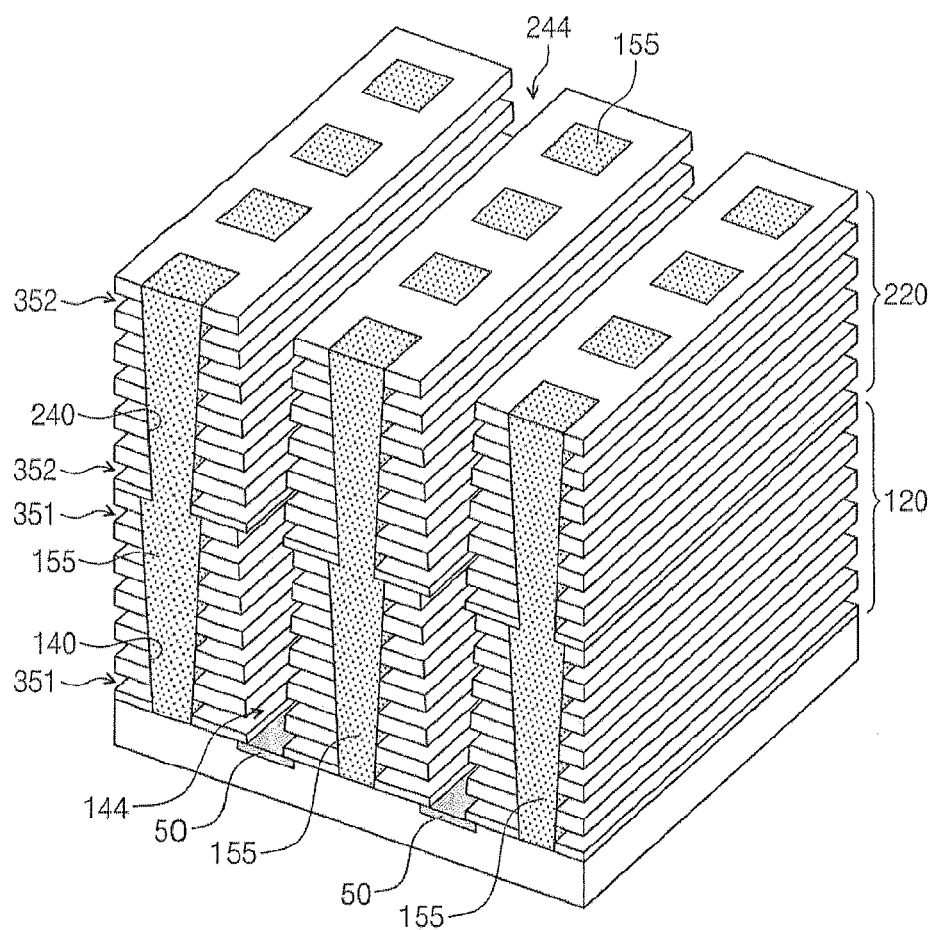

Referring to FIG. 13, the upper sacrificial layers 230 and the lower sacrificial layers 130 exposed by the upper and lower trenches 244 and 144 are selectively removed to form upper and lower recess regions 352 and 351 between the upper and lower insulating layers 220 and 120. In an embodiment, this operation may be performed by using the etch method described with reference to FIG. 5. As a result, the upper and lower recess regions 352 and 351 may be formed substantially at the same time.

Figure 14:
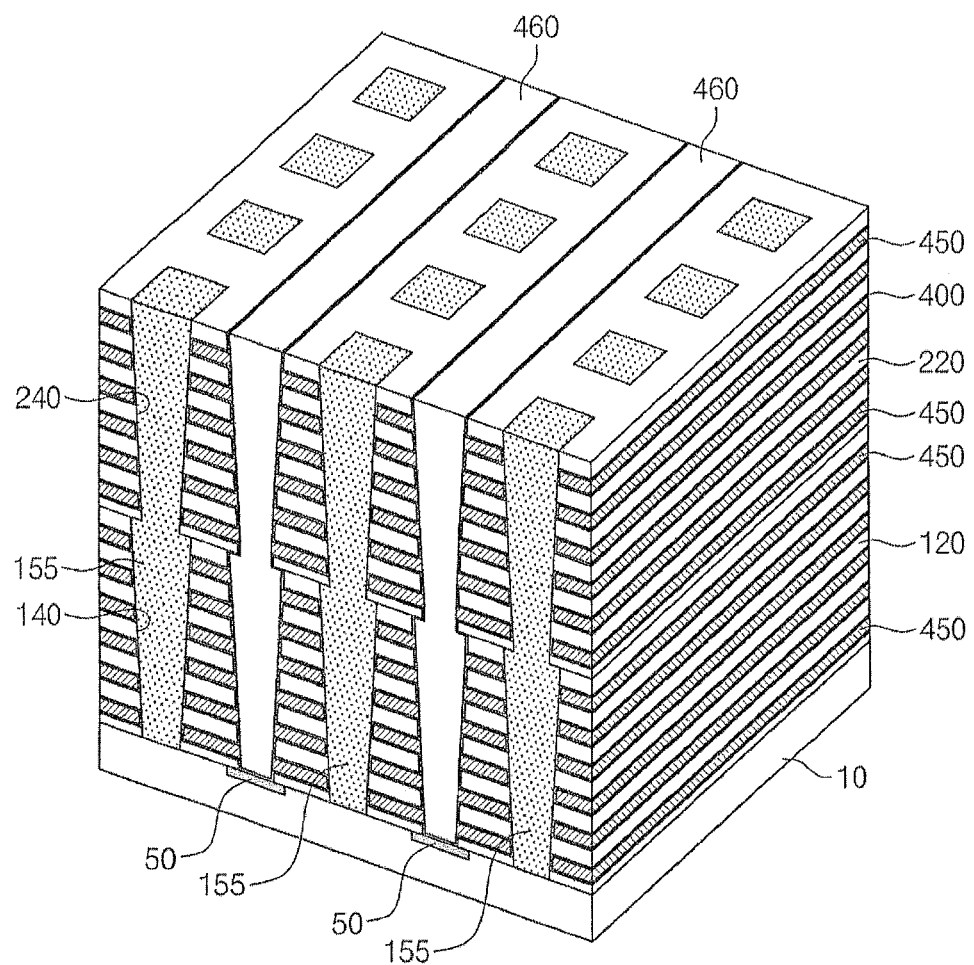

Referring to FIG. 14, an information storage layer 400 and a conductive pattern 450 are formed in each of the upper and lower recess regions 352 and 351, and then, an electrode separating pattern 460 filling the upper and lower trenches 244 and 144 is formed. In an embodiment, this operation may be performed by using operations described with reference to FIG. 6.

Since the information storage layer 400 and the conductive pattern 450 are formed on the upper and lower recess regions 352 and 351, the information storage layer 400 and the conductive patterns 450 formed in the upper recess region 352 may be formed substantially at the same time with those formed in the lower recess region 351. Accordingly, non-uniformity in electrical properties between electronic elements formed in the upper multi-layered structure 200 and the lower multi-layered structure 100 can be prevented.

FIGS. 16 through 20 are cross-sectional views showing three dimensional semiconductor memory device according to embodiments of the inventive concept.

Figure 16:
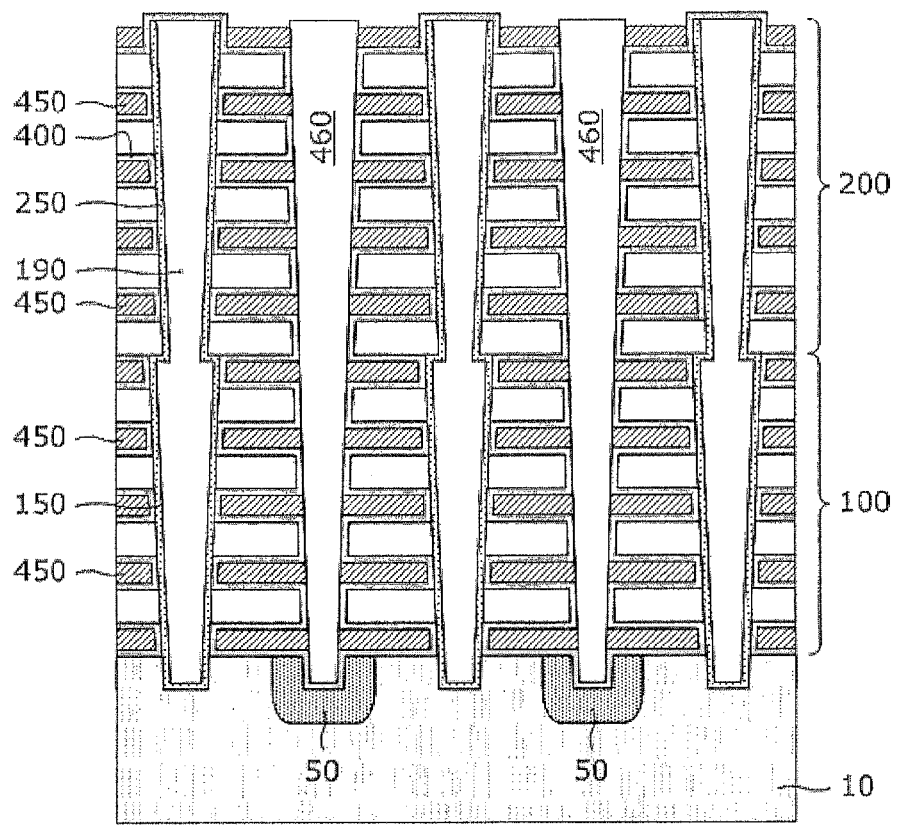
FIGS. 16 through 20 are cross-sectional views of three-dimensional semiconductor memory devices according to embodiments of the inventive concept.

According to an embodiment of the inventive concept, lower and upper multi-layered structures 100 and 200 and semiconductor patterns 250 penetrating the lower and upper multi-layered structures 100 and 200 are provided. The lower and upper multi-layered structures 100 and 200 may be formed by using the fabricating method described with reference to FIGS. 1 and 2, and the semiconductor patterns 250 may be formed by using the fabricating method described with reference to FIGS. 8 through 14. In an embodiment, an information storage layer 400, conductive patterns 450 and electrode separating patterns 460 may be formed by using the fabricating method in embodiments described with reference to FIGS. 1 through 7. Referring to FIG. 16, each of the semiconductor patterns 250 may be divided into a lower semiconductor pattern penetrating the lower multi-layered structure 100, and an upper semiconductor pattern penetrating the upper multi-layered structure 200.

When two layers are formed through different processes, a boundary interface is formed between the two layers, and the boundary interface can be identified through an analysis process called a Decap or chip reverse engineering. For example, the interface boundary may be seen visually through a scanning electron microscope (SEM) or transmission electron microscope (TEM) photograph. However, according to an embodiment, as described with reference to FIG. 10, since the lower and upper semiconductor patterns are formed by using the same process, the lower and upper semiconductor patterns are formed simultaneously. As a result, the lower and upper semiconductor patterns are seamlessly connected with each other, so that the boundary interface is not formed therebetween. The semiconductor pattern 250 according to this embodiment is a single body, which does not have any boundary interface therein.

According to an embodiment, since the information storage layer 400 and the electrode separating pattern 460 are also formed by using the fabricating method of embodiments described with reference to FIGS. 1 through 7, each of the information storage layer 400 and the electrode separating pattern 460 may be formed with a single body without a boundary interface therein, similarly to the semiconductor pattern 250.

Figure 17:
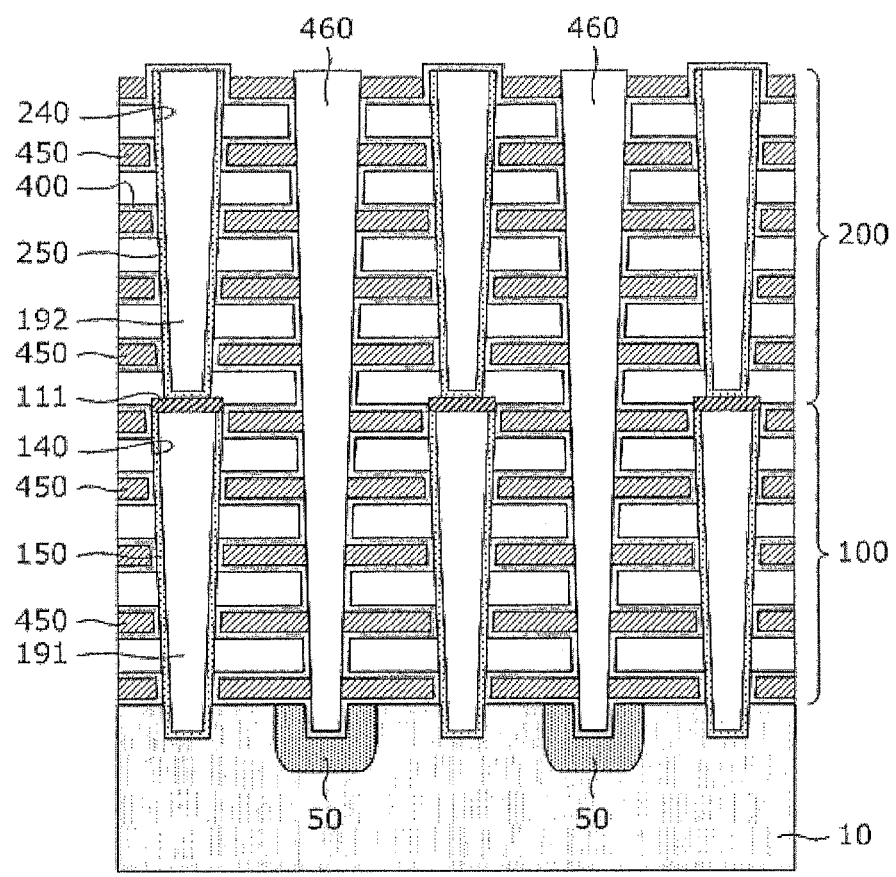

According to an embodiment of the inventive concept, as shown in FIG. 17, lower and upper multi-layered structures 100 and 200, a lower semiconductor pattern 150 penetrating the lower multi-layered structure 100, an upper semiconductor pattern 250 penetrating the upper multi-layered structure 200, and electrode separating patterns 460 are provided. The electrode separating patterns 460 may be formed by using the fabricating method of embodiments described with reference to FIGS. 1 through 7. Accordingly, the electrode separating pattern 460 may be provided as a single body without a boundary interface therein.

In an embodiment, each of the lower semiconductor pattern 150 and the upper semiconductor pattern 250 may be formed to substantially conformally cover inner walls of the lower and upper penetrating holes 140 and 240 as described with reference to FIG. 15. Accordingly, each of the lower and upper semiconductor patterns 150 and 250 may be formed to have a "U"-shaped section.

In an embodiment, the lower and upper penetrating holes 140 and 240 in which the lower and upper semiconductor patterns 150 and 250 are formed may be filled with a lower filling insulating layer 191 and an upper filling insulating layer 192, respectively. In an embodiment, an intermediate conductive pattern 111 may be further disposed between the lower and upper semiconductor patterns 150 and 250. The intermediate conductive pattern 111 may comprise a conductive material such as polysilicon that can improve connection reliability and ohmic contact property between the lower and upper semiconductor patterns 150 and 250.

Figure 18:
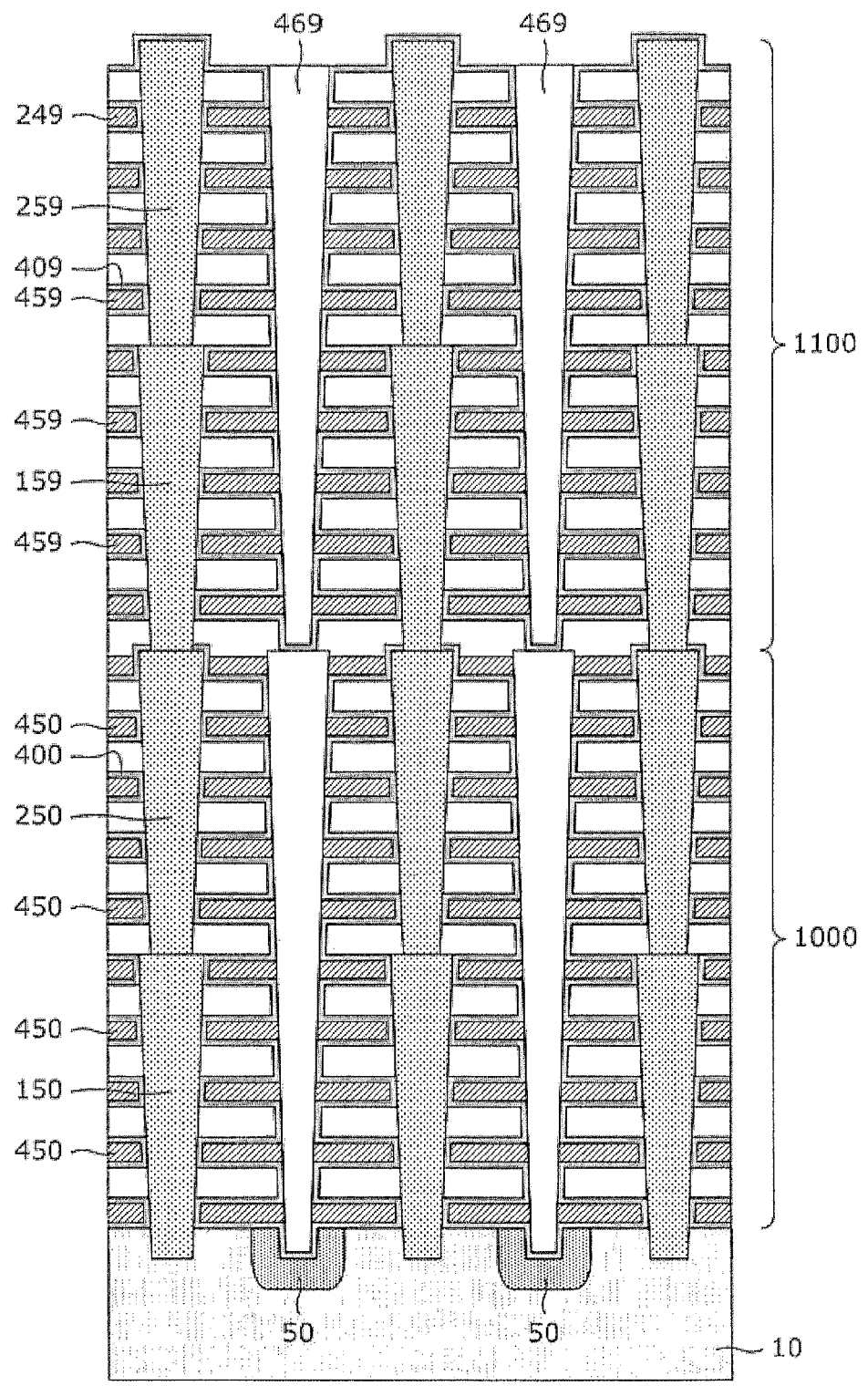
Figure 19:
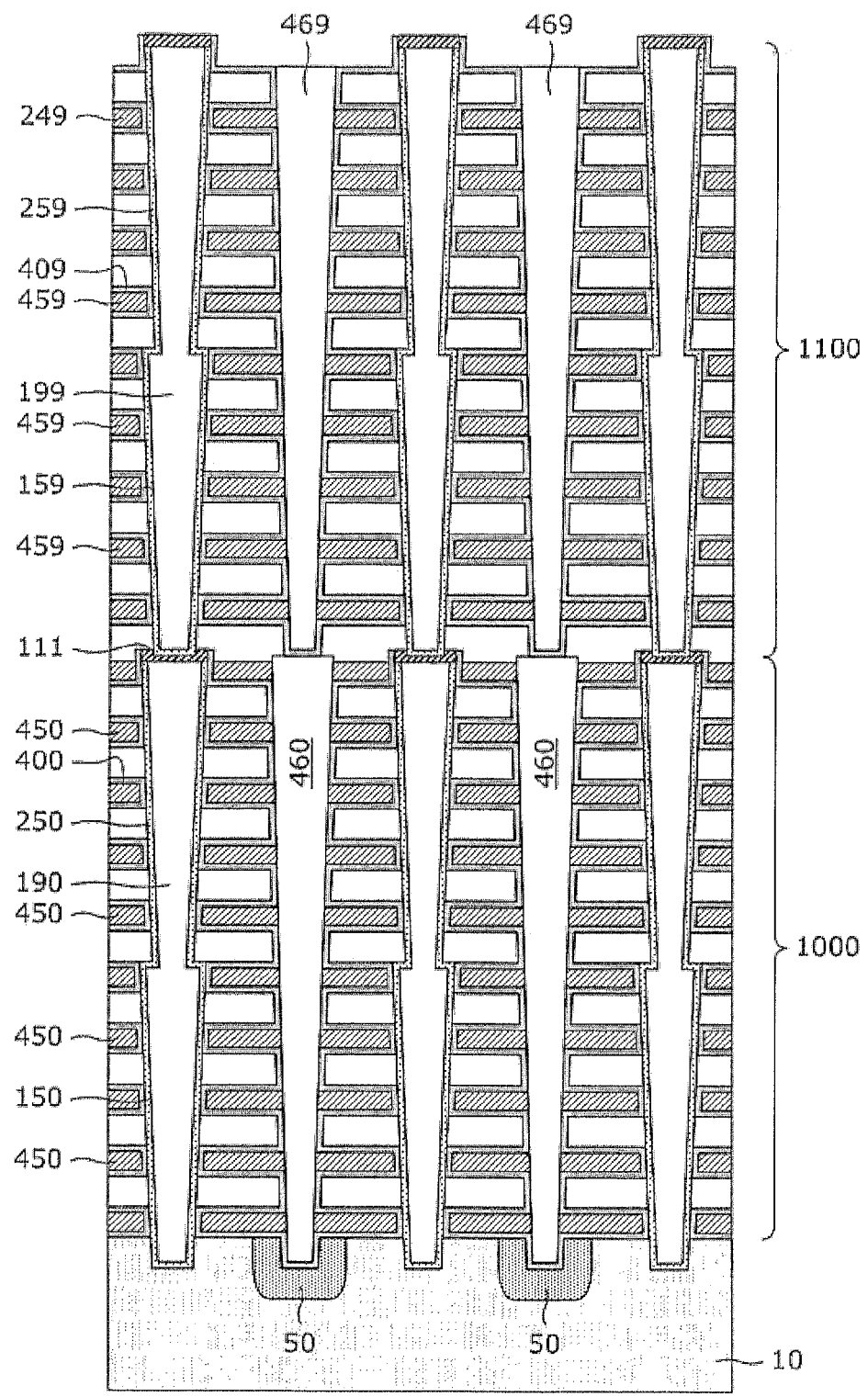
Figure 20:
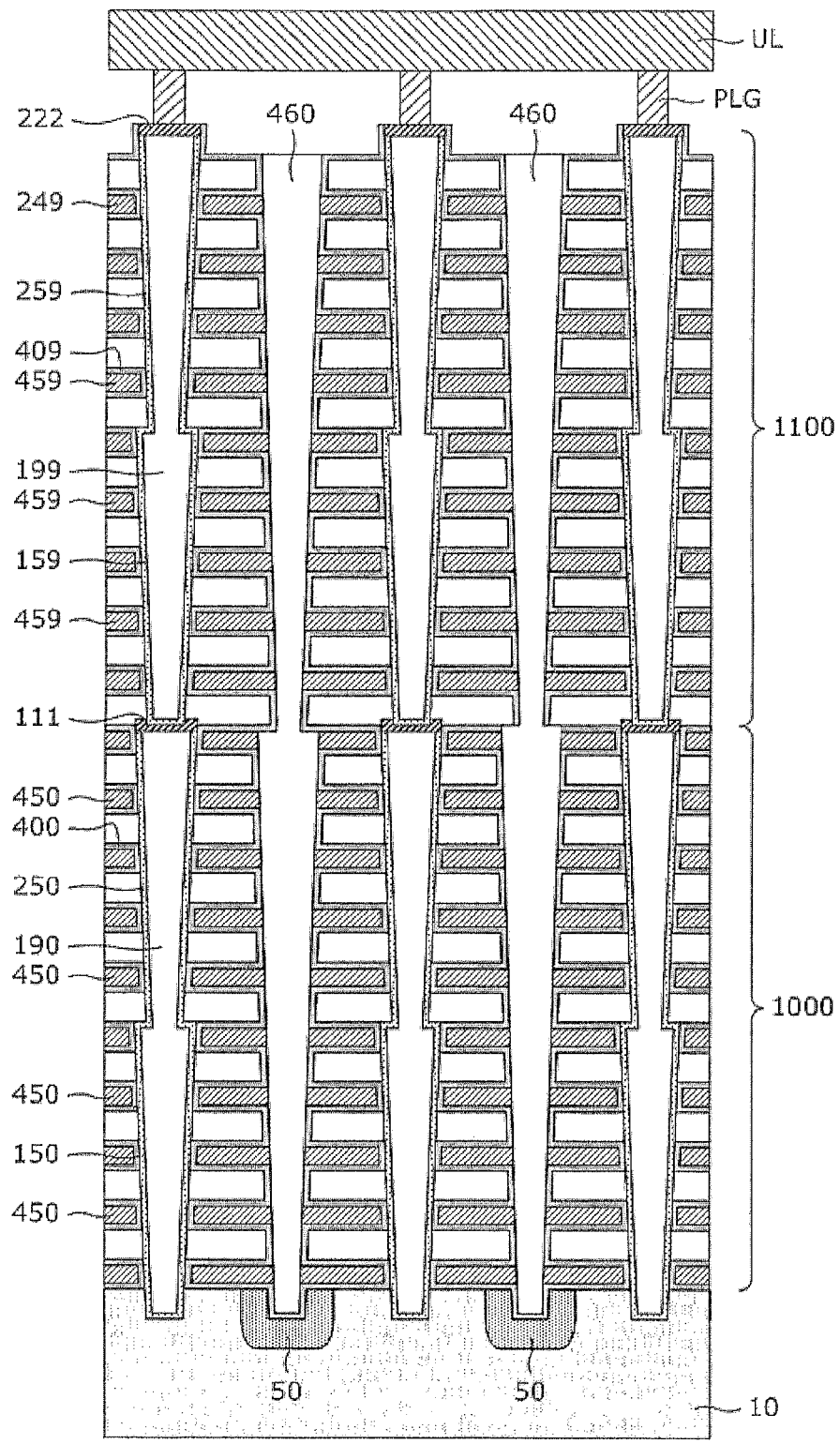

According to an embodiment of the inventive concept, as shown in FIGS. 18 through 20, a plurality of memory structures 1000, 1100 sequentially stacked on a substrate 10 are provided. Each of the stacked memory structures 1000, 1100 may be one of those disclosed in the embodiments described with reference to FIGS. 1 through 17. That is, the stacked memory structures 1000, 1100 may have substantially the same configuration except for a difference in distance from the substrate 10, or may have different structures. Referring to FIG. 18, each of the memory structures 1000, 1100 may be formed by using the fabricating method of the embodiment described with reference to FIGS. 1 through 7.

Referring to FIG. 19, each of the memory structures 1000, 1100 may be formed by using the fabricating method of the embodiment described with reference to FIG. 16.

Referring to FIG. 20, electrode separating patterns 460 penetrating all of the memory structures 1000, 1100 are disposed. The electrode separating patterns 460 may be formed by using the fabricating method of the embodiment described with reference to FIGS. 8 through 15 and includes using a sacrificial layer as a mold for defining a shape of a trench and then selectively removing the sacrificial layer. Accordingly, the electrode separating patterns 460, 469 may be provided as a single body, which does not have a boundary interface therein, and may be formed to penetrate the plurality of memory structures 1000, 1100, respectively.

Fabricating methods of embodiments described with reference to FIGS. 1 through 19 may further include forming a plug PLG connected with a semiconductor pattern, and an upper interconnection UL crossing the conductive patterns 450. In a flash memory device, the upper interconnection UL may be used as a bit line for a memory cell array, and the conductive patterns 450, 459 may be used as a word line for the memory cell array. For example, in a NAND flash memory, the uppermost and lowermost conductive patterns may be used as a string select line and a ground select line, respectively.

Figure 21:
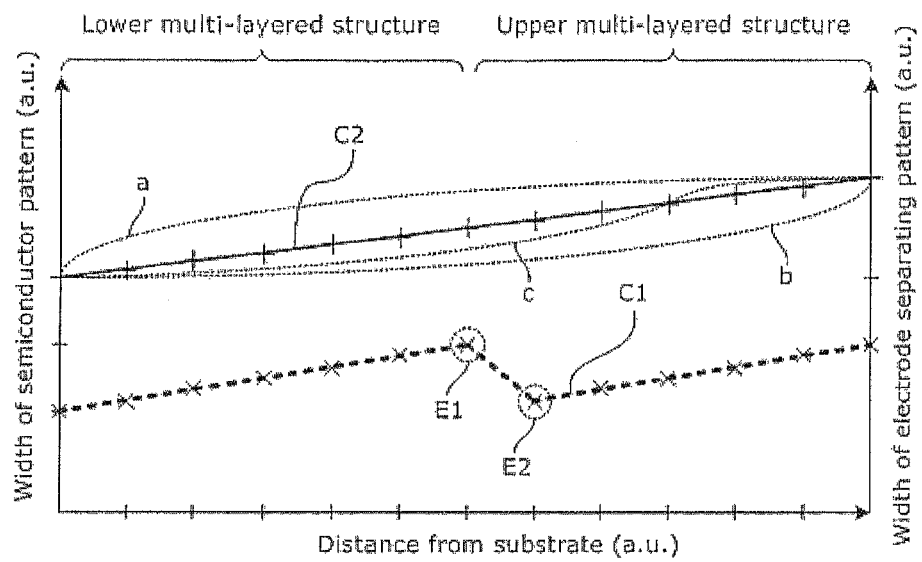
FIGS. 21 through 23 are diagrams showing relations between a distance from a substrate and a width of a semiconductor pattern according to embodiments of the inventive concept.
Figure 22:
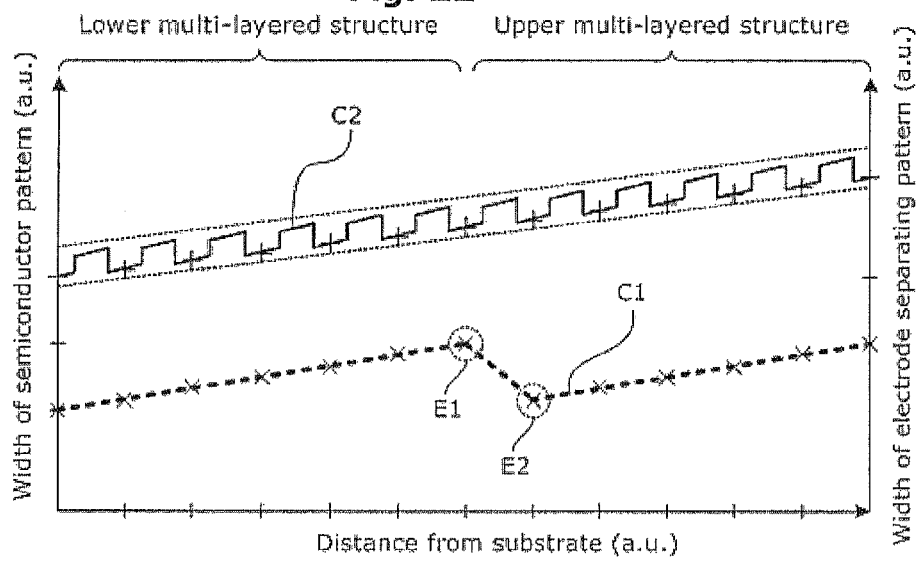
Figure 23:
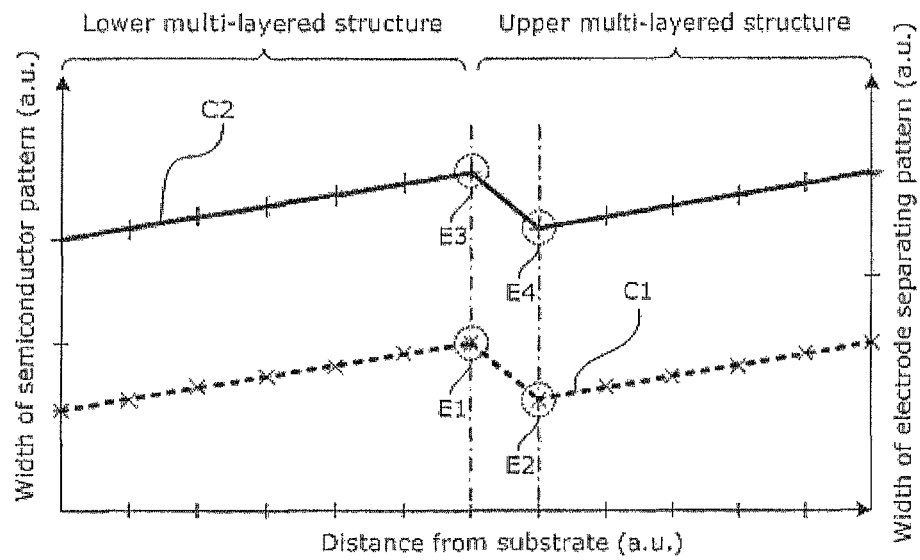

FIGS. 21 through 23 are graphs showing a width of a semiconductor pattern and a width of an electrode separating pattern according to a distance from a substrate (i.e., height). In the graphs, a curve denoted by a reference symbol "C1" illustrates a width of a semiconductor pattern according to a distance from a substrate, and a curve denoted by a reference symbol "C2" illustrates a width of an electrode separating pattern according to a distance from a substrate.

According to embodiments of the inventive concept, the width of the semiconductor pattern in the lower and upper multi-layered structures 100 and 200 increases as the distance from the substrate increases as shown in FIGS. 3 through 7 and FIGS. 10 through 20. The width of the semiconductor pattern may decrease locally around a boundary between the lower and upper multi-layered structures 100 and 200. Accordingly, referring to FIGS. 21 through 23, the curve "C1" may have two extremal values E1 and E2 around the boundary between the lower and upper multi-layered structures 100 and 200. Herein, the extremal value indicates a functional value (i.e., width) at a point where the sign of gradient of a curve is changed. Also, the extremal value is a result obtained from a curve interpolated in the level of thickness of semiconductor patterns such that a microscopic change of curve due to a surface roughness of the semiconductor patterns can be neglected.

According to embodiments of the inventive concept, as shown in FIGS. 6 and 7 and FIGS. 16 through 20, the width of the electrode separating pattern shows a monotone increasing behavior as the distance from the substrate increases. Herein, the expression "monotone increasing" involves all cases that the gradient of a curve can be changed under the condition that the sign of a curve gradient is positive, as exemplary shown by curves a, b and c in FIG. 21. For example, the electrode separating pattern may have a linearly varying width or a width that can be expressed by curves having an invariant sign of gradient.

According to embodiments of the inventive concept, when the conductive patterns 450 are horizontally recessed, the electrode separating pattern 460 may extend horizontally from the trench 300 to have horizontal protrusions disposed in the upper and lower recess regions 352 and 351 as shown in FIG. 7. In an embodiment, the curve "C2" may have a saw-toothed waveform as shown in FIG. 22. So, nevertheless, the curve "C2" shows a substantially monotone increasing behavior in a monotone increasing envelope. For example, as expressed by marks "+", an interpolated curve of widths of the electrode separating pattern measured at heights of the conductive patterns 450 shows a monotone increasing behavior.

According to embodiments of the inventive concept, as shown in FIG. 23, the curve "C2" expressing the width of the electrode separating pattern may have two or more extremal values E3, E4. For example, as shown in an embodiment described with reference to FIGS. 8 through 14, when the plug-type lower pattern 162 and the line-type lower pattern 164 are used as molds for forming a semiconductor pattern and an electrode separating pattern, respectively, such a technical feature can be found. In an embodiment described with reference to FIGS. 8 through 14, the extremal values E3, E4 of the curve "C2" may appear around a boundary between the lower and upper multi-layered structures 100 and 200, like in the curve "C1". That is, a height (i.e., distance from the substrate) that the width of the electrode separating pattern has an extremal value may be substantially the same as a height that the width of the semiconductor pattern has an extremal value, as shown in FIG. 23.

According to a process recipe in the etching operation for forming the trench 300, the lower penetrating hole 140 and the upper penetrating hole 240, at least one of the trench 300, the lower penetrating hole 140 and the upper penetrating hole 240 may be formed to have a sectional shape such as, for example, entasis, reversed entasis and barrel. When openings (e.g., the trench 300, the lower penetrating hole 140 and the upper penetrating hole 240) penetrating the lower multi-layered structure 100 are formed between the process steps for forming the lower multi-layered structure 100 and the upper multi-layered structure 200, a sidewall slope of layers filling the openings may be sharply changed around the localized boundary between the lower and upper multi-layered structures 100 and 200. For example, x-coordinates of the two extremal values E1 and E2 of the curve "C1" may be substantially same as each other, or a distance between x-coordinates of the two extremal values E1 and E2 may be less than the thickness of the information storage layer 400.

FIGS. 25 through 31 are cross-sectional views illustrating a semiconductor memory device according to an embodiment of the inventive concept.

Figure 25:
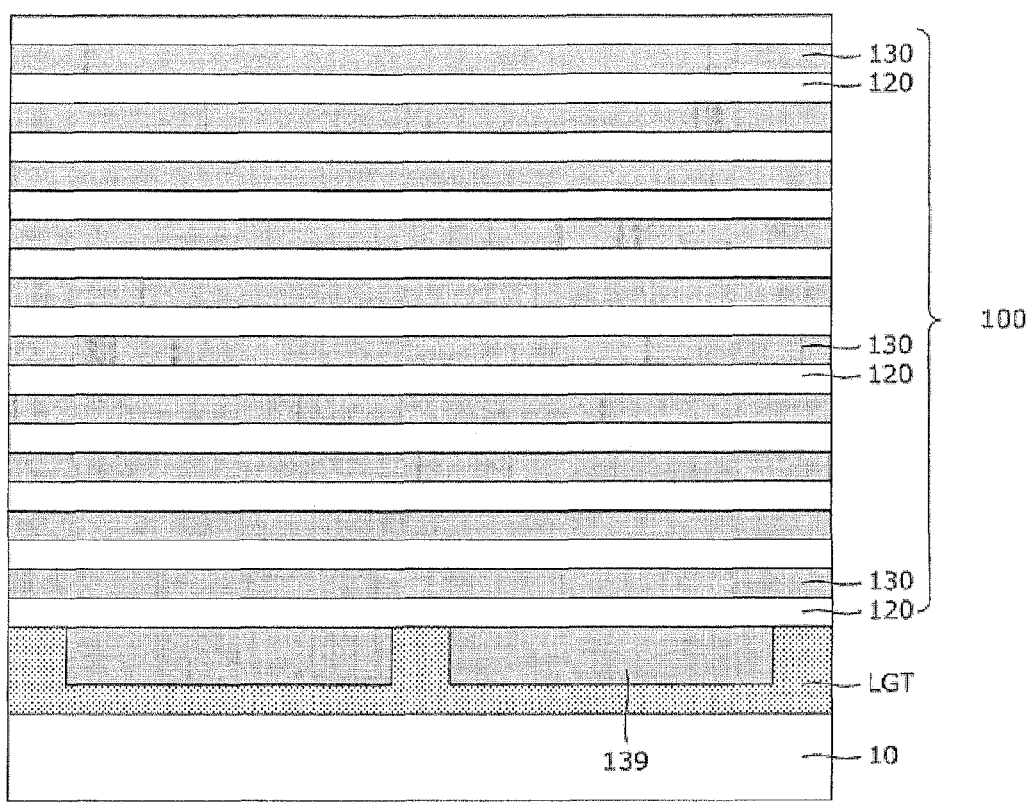
FIGS. 25 through 31 are cross-sectional views illustrating a method of forming a semiconductor memory device according to an embodiment of the inventive concept.

Referring to FIG. 25, after a buried sacrificial pattern 139 is formed in a substrate 10, a lower multi-layered structure 100 is formed on the buried sacrificial pattern 139. The lower multi-layered structure 100 may include a plurality of lower insulating layers 120 and a plurality of lower sacrificial layers 130, which are alternatingly and repeatedly stacked on top of each other.

Figure 33:
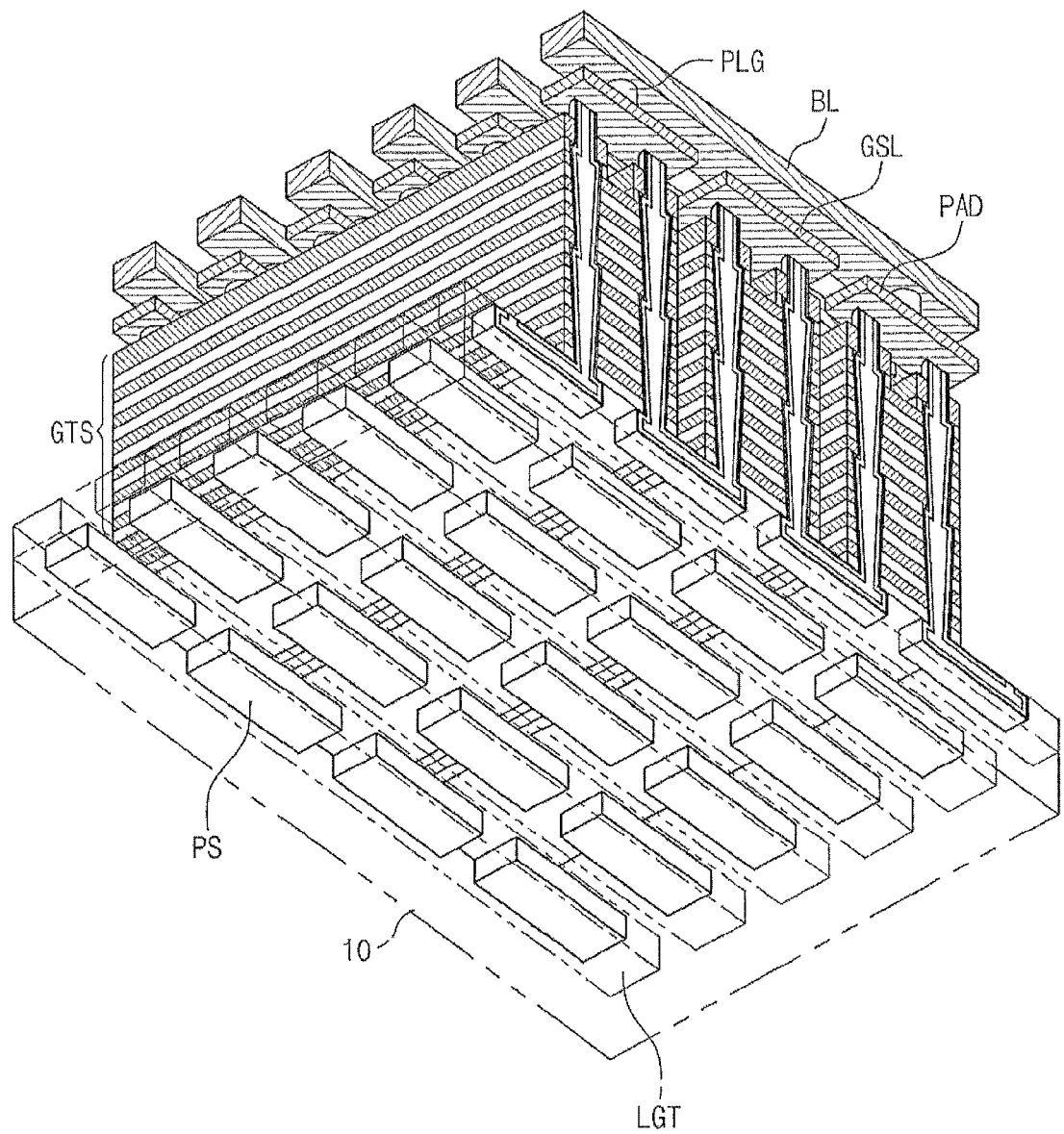

The buried sacrificial pattern 139 may comprise a material having an etch selectivity with respect to the lower insulating layers 120 and the lower sacrificial layers 130, or a material having an etch selectivity with respect to the lower insulating layers 120. Referring to FIGS. 25 and 33, the buried sacrificial patterns 139 may have an island shape and be arranged two-dimensionally (e.g., PS of FIG. 33). According to an embodiment, the buried sacrificial pattern 139 may be formed by using a process of forming an insulating pattern for device isolation.

Referring to FIG. 25, the buried sacrificial patterns 139 may be patterns inserted into a lower gate LGT according to an embodiment. The lower gate LGT may be a heavily doped impurity region formed in the substrate 10 or a conductive material layer formed on the substrate 10. In an embodiment, each of the lower gates LGT may be formed to enclose a bottom surface and sidewalls of the two or more buried sacrificial patterns 139.

Figure 26:
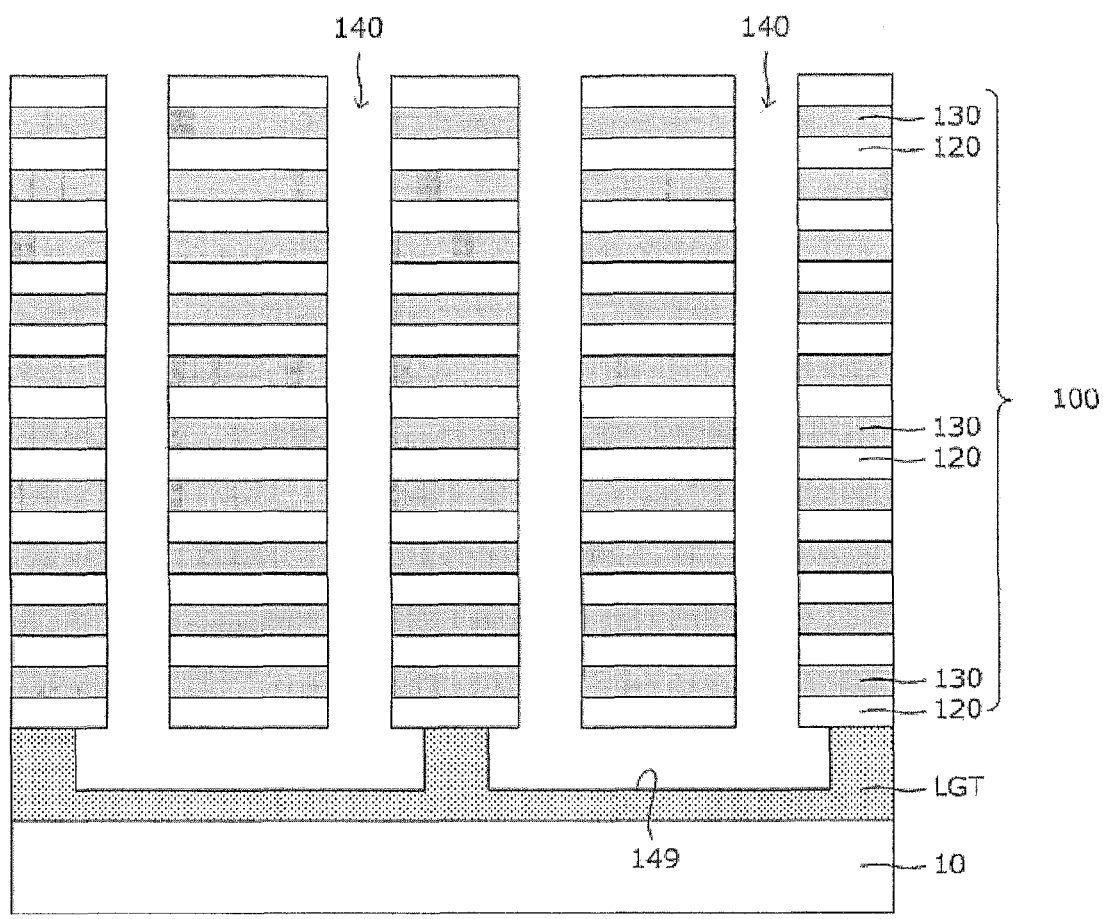

Referring to FIG. 26, lower penetrating holes 140 penetrating the lower multi-layered structure 100 to expose a top surface of the buried sacrificial pattern 139 are formed, and then the exposed buried sacrificial pattern 139 is selectively removed to form horizontal penetrating portions 149. Two of the lower penetrating holes 140 may be formed on one buried sacrificial pattern 139. Accordingly, as shown in FIG. 26, one horizontal penetrating portion 149 and a pair of the lower penetrating holes 140 formed on the horizontal penetrating portion 149 may form a "U"-shaped opening.

Figure 27:
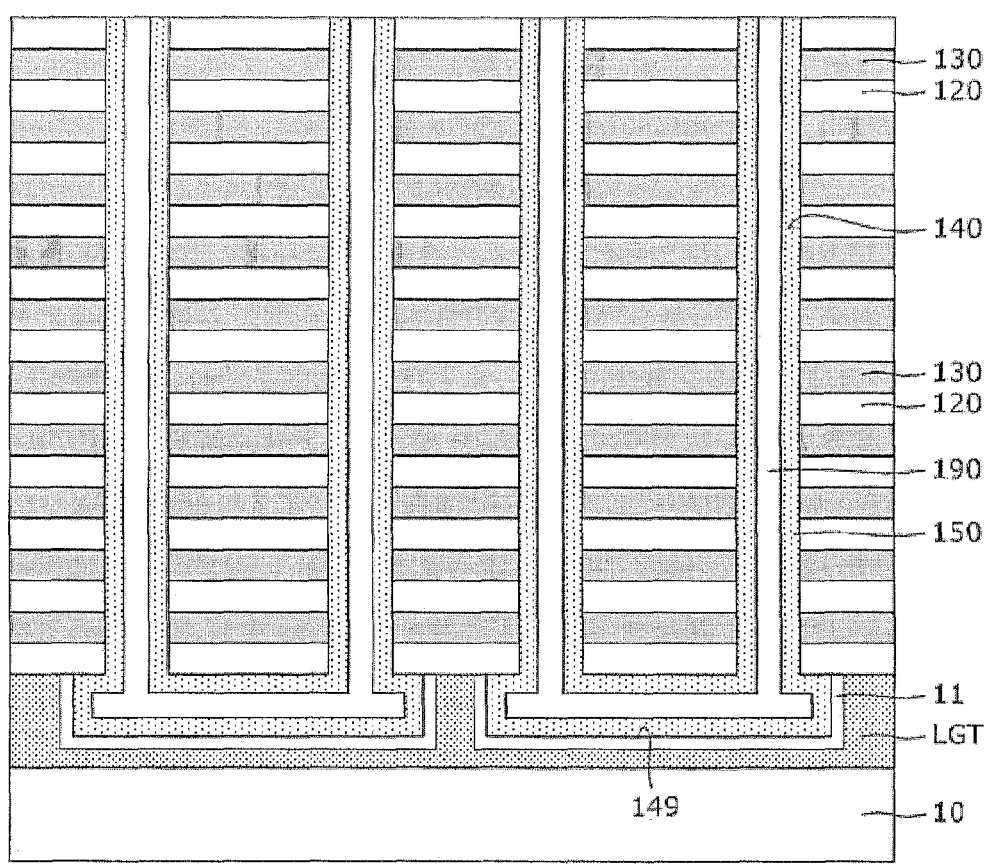

Referring to FIG. 27, a semiconductor pattern 150 covering an inner wall of the "U"-shaped opening is formed. The semiconductor pattern 150 may be formed such that the semiconductor pattern 150 may not completely fill the "U"-shaped opening as shown in FIG. 27. At least some of the "U"-shaped opening in which the semiconductor pattern 150 is formed may be filled with a buried insulating layer 190. The semiconductor pattern 150 and the buried insulating layer 190 may be formed by using a fabricating method in the embodiment described with reference to FIG. 15.

According to an embodiment, prior to forming the semiconductor pattern 150, an insulating layer 11 may be formed on a surface of the substrate 10 exposed by the horizontal penetrating portion 149 or on a surface of the lower gate LGT. For example, the insulating layer 11 may be formed by using a thermal oxidation process or a CVD process.

Figure 28:
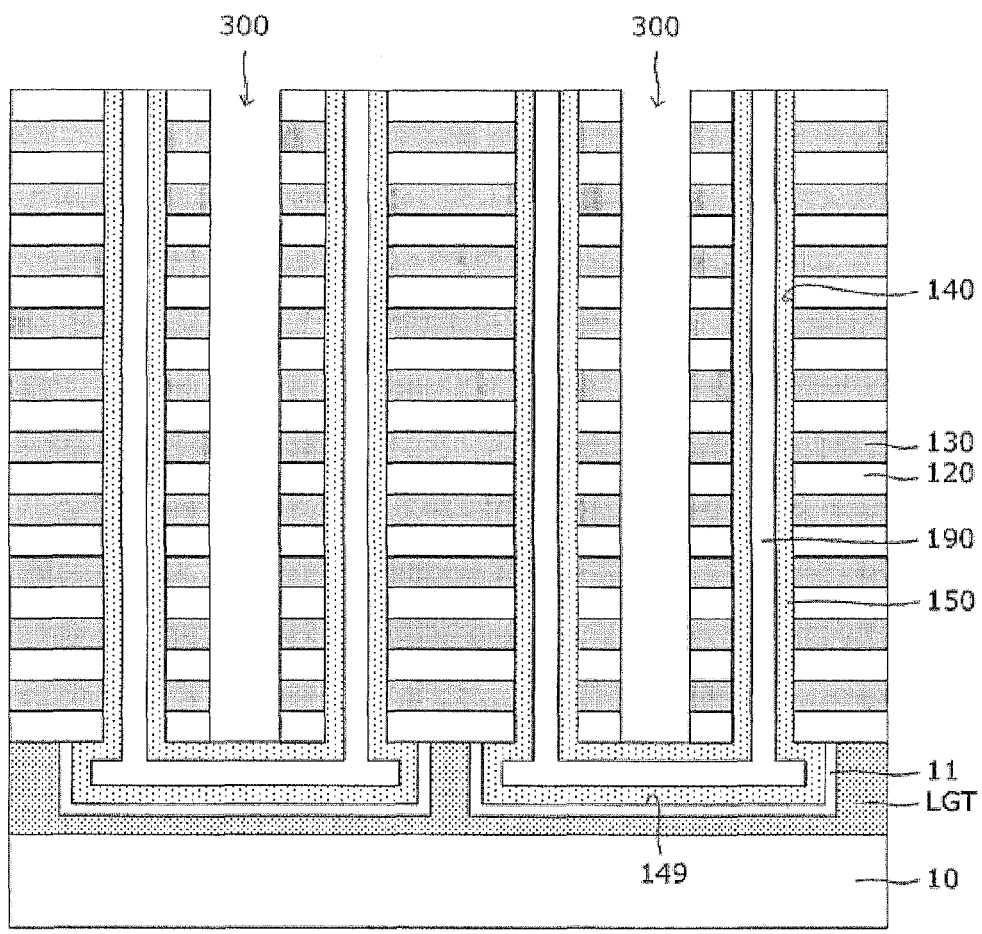

Referring to FIG. 28, the lower multi-layered structure 100 is patterned to form trenches 300 crossing the horizontal penetrating portions 149. The trenches 300 may be formed between a pair of the lower penetrating holes 140 connected to one horizontal penetrating portion 149. The trenches 300 may be formed by using a patterning method in an embodiment described with reference to FIG. 4, and may be formed to expose inner walls of the lower sacrificial layers 130.

Figure 29:
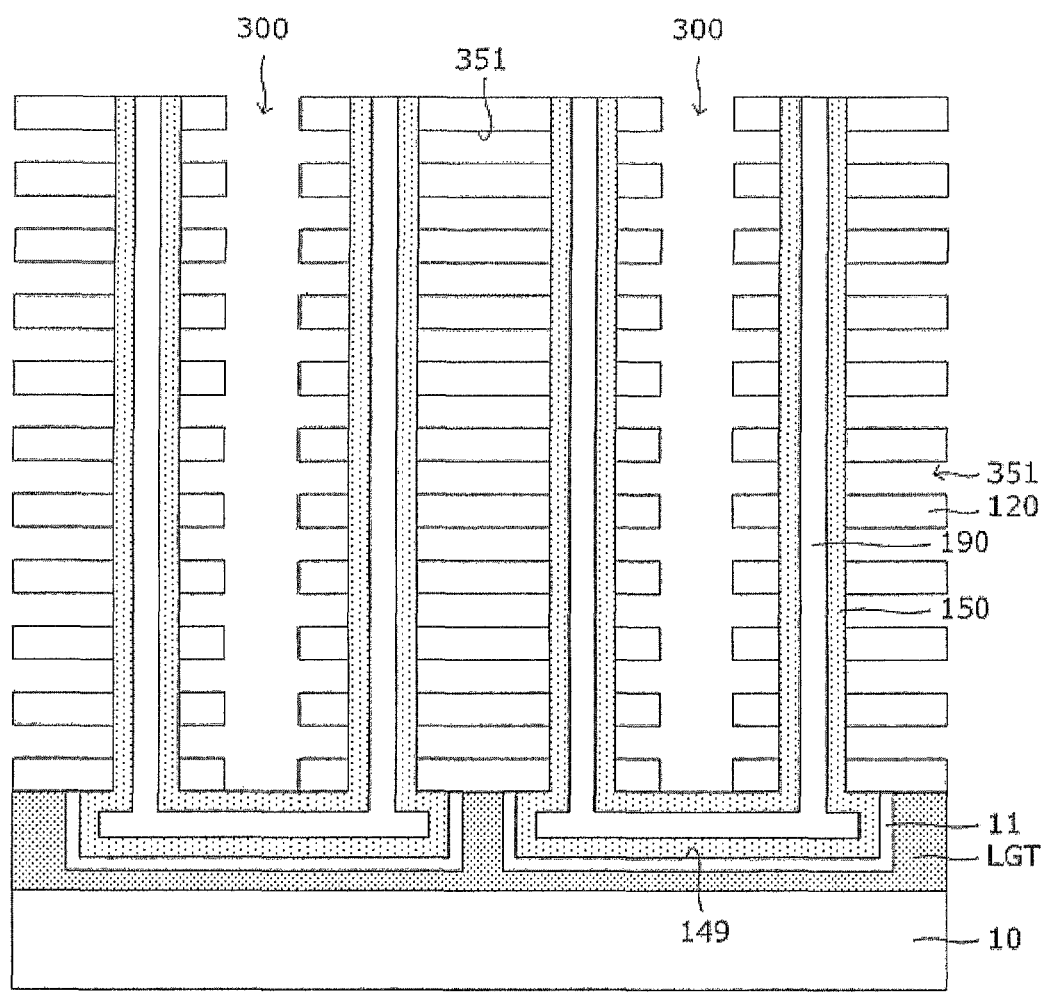

Referring to FIG. 29, the lower sacrificial layers 130 whose sidewalls are exposed by the trenches 300 are selectively removed to form lower recess regions 351 between the lower insulating layers 120. According to an embodiment, the lower recess regions 351 may be gap regions extending horizontally from the trench 300 between the lower insulating layers 120, and may be formed to expose the sidewalls of the lower semiconductor patterns 150. Forming the lower recess regions 351 may include isotropically etching the lower sacrificial layers 130 by using an etch recipe having an etch selectivity with respect to the lower insulating layers 120.

Figure 30:
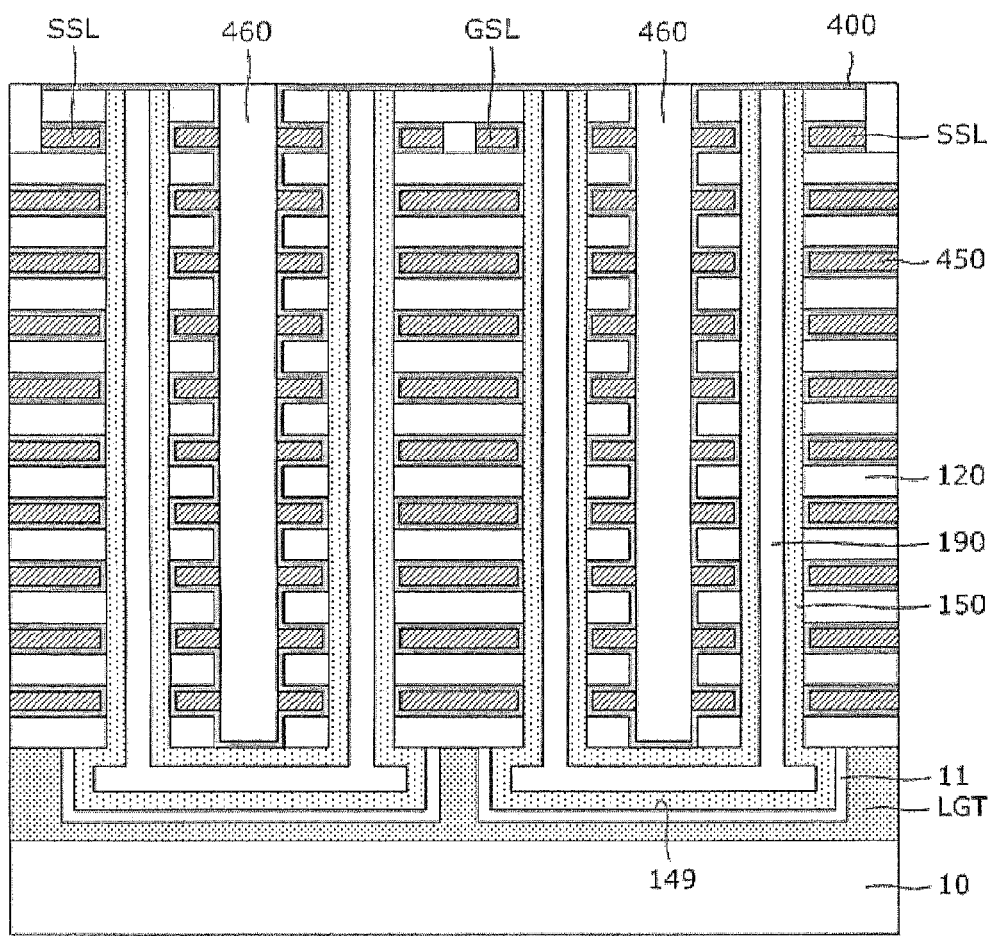

Referring to FIG. 30, an information storage layer 400 and a conductive pattern 450 are formed in each of the lower recess regions 352. Forming the information storage layer 400 and the conductive pattern 450 may include forming the information storage layer 400 and a conductive layer sequentially covering the trenches 300 and the lower recess regions 351, and removing the conductive layer from an inside of the trench 300 to locally leave the conductive patterns 450 in the lower recess regions 351. Thereafter, an electrode separating pattern 460 filling the trench 300 is formed.

Referring to FIG. 30, patterning the uppermost layer among the conductive patterns 450 to define a string select line SSL may be performed according to an embodiment. Alternatively, forming a string select line SSL or a ground select line GSL on the conductive patterns 450 may be performed.

Figure 31:
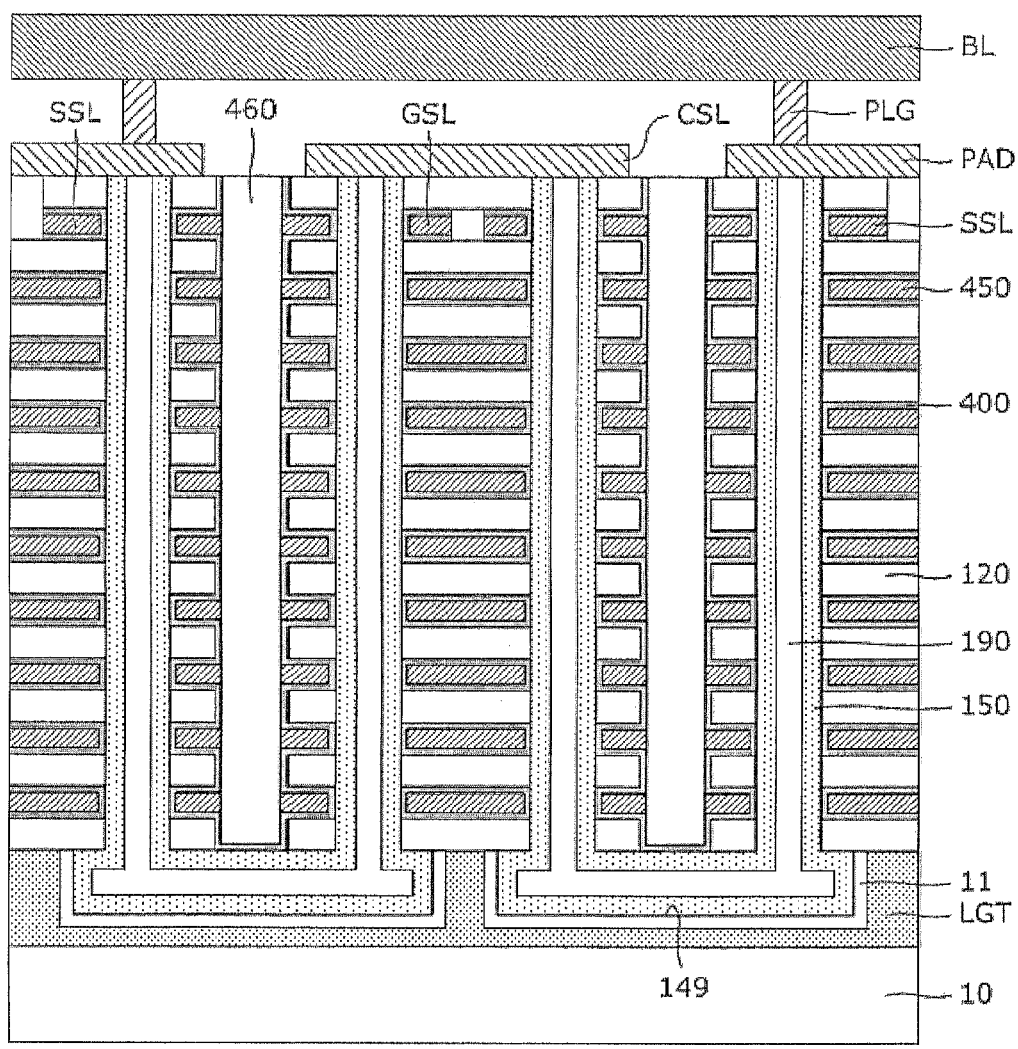

Referring to FIG. 31, pads PAD and a common source line CSL connected with the semiconductor patterns 150 are formed. Then, bit lines BL connected with the pads PAD may be formed. The pad PAD and the common source line CSL may be formed at different heights. In an embodiment, a conductive plug PLG may be disposed between the bit line BL and the pad PAD. According to embodiments, some of the conductive patterns 450 may be used as word lines constituting a cell array of a NAND flash memory. In an embodiment, the lower gate LGT may be configured to control potential of lower regions of the semiconductor pattern 150 disposed in the horizontal penetrating portions 149.

Figure 32:
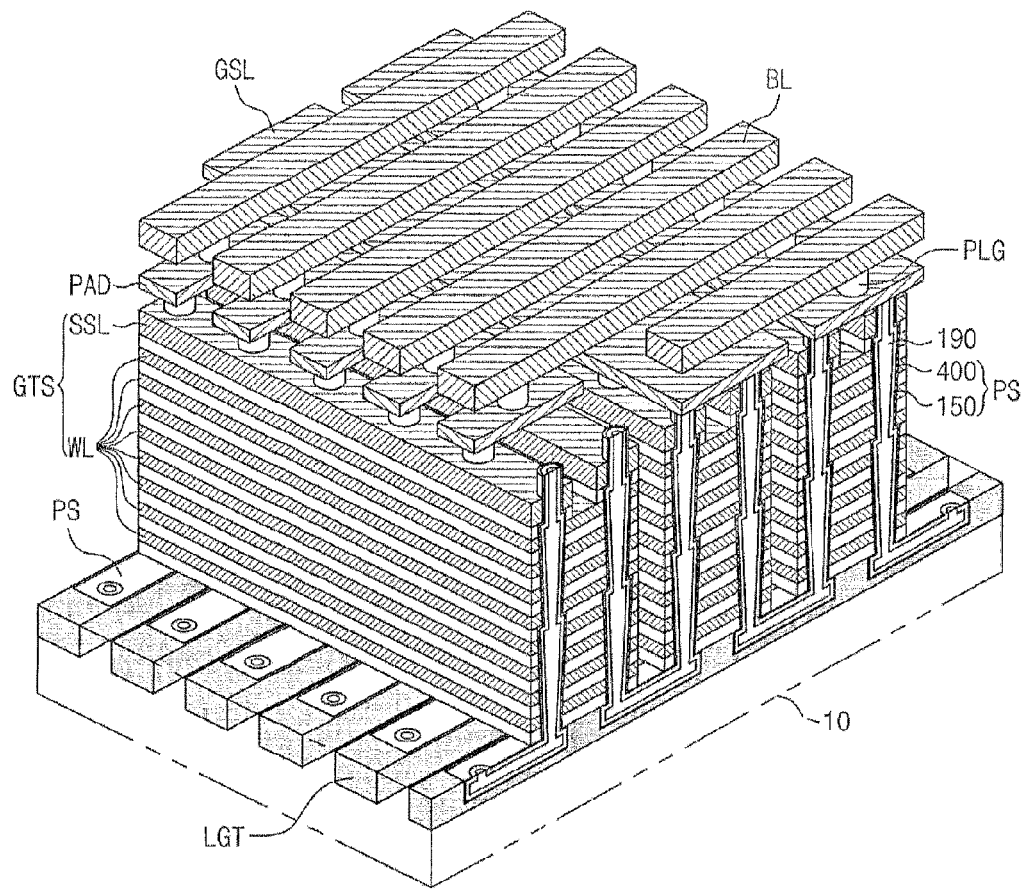
FIGS. 32 through 34 are perspective views for describing a semiconductor device according to an embodiment of the inventive concept.
Figure 34:
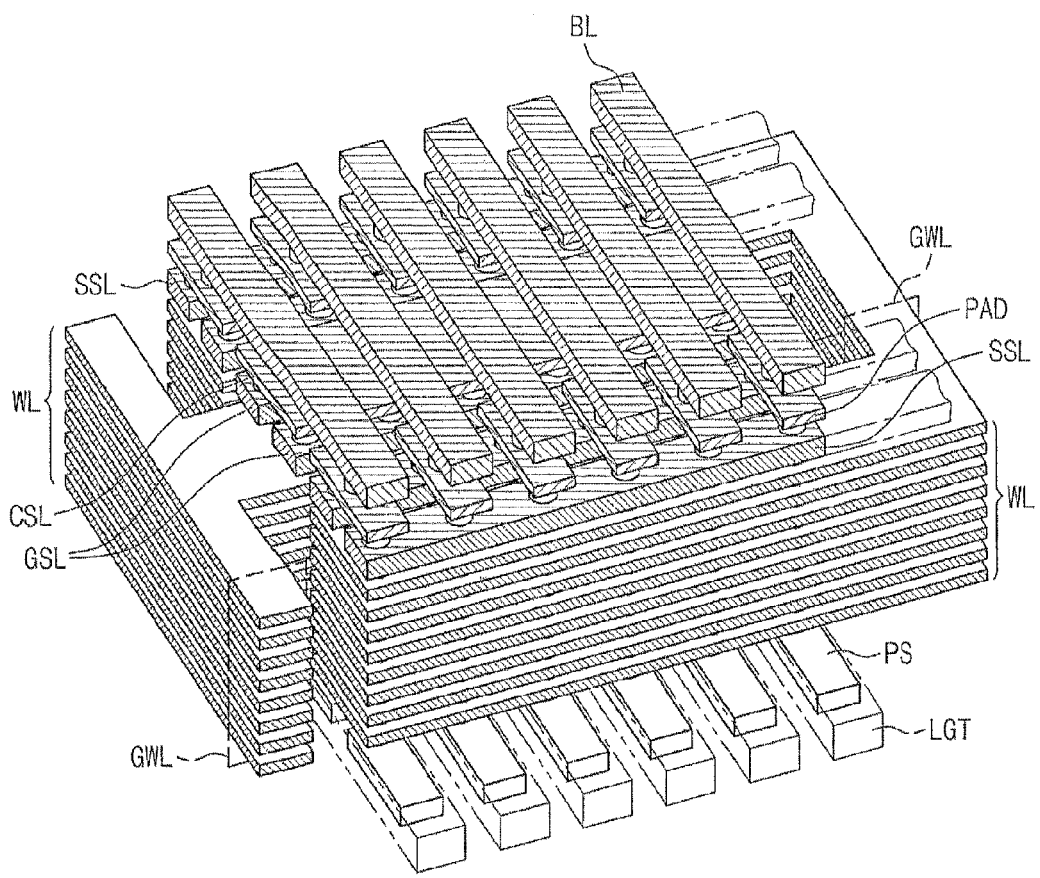

FIGS. 32 through 34 are perspective views for describing a semiconductor device according to an embodiment of the inventive concept. FIGS. 32 and 33 are perspective views of a semiconductor device viewed in two different directions according to an embodiment. FIG. 34 is a perspective view for describing an arrangement of word lines in the semiconductor device of FIGS. 32 and 33 according to an embodiment.

Referring to FIGS. 32 and 33, a semiconductor device may include bit lines BL on a substrate 10, a gate structure GTS between the substrate 10 and the bit line BL, a common source line CSL between the gate structure GTS and the bit line BL, and a pipe structure PS penetrating the gate structure GTS. The pipe structure PS may be a "U" shape whose both ends are coupled to the bit line BL and the common source line CSL, respectively. Between the gate structure GTS and the bit line BL, a plug PLG and a pad PAD may be disposed to connect electrically the bit lines BL to the gate structures GTS.

The gate structure GTS may include a plurality of word lines WL sequentially stacked, and select lines disposed between the word line WL and the bit line BL. The select lines may include string select lines SSL disposed between the word line WL and the pad PAD, and a ground select line GSL disposed between the common source line CSL and the word line WL. The string select lines SSL and the ground select line GSL may be formed by using the process for forming the word line WL, or may be independently formed by using a different process.

The word lines WL may include a pair of global word lines GWL respectively disposed at both ends of the word lines WL. Referring to FIG. 34, even-numbered word lines may be electrically connected with one of the pair of global word lines GWL, and odd-numbered word lines may be electrically connected with the other of the pair of global word lines GWL.

The pipe structure PS may include a semiconductor pattern 150 and an information storage layer 400 covering an outer wall of the semiconductor pattern 150. Each of the semiconductor patterns 150 may include a pair of vertical semiconductor patterns penetrating the gate structure GTS, and a horizontal semiconductor pattern connecting the vertical semiconductor patterns below the gate structure GTS. Referring to FIGS. 32 and 33, two vertical semiconductor patterns constituting one semiconductor pattern 150 may penetrate the word lines WL separated from each other. In an embodiment, the horizontal semiconductor pattern may extend from a portion below one word line WL to a portion below another word line WL adjacent thereto. An electric potential of the horizontal semiconductor patterns may be controlled by the lower gate LGT disposed below the horizontal semiconductor patterns.

According to an embodiment, the semiconductor pattern 150 may be formed by applying a method in the embodiment described with reference to FIG. 15. Referring to FIGS. 32 and 33, the semiconductor pattern 150 may cover inner walls of holes penetrating the gate structure GTS. According to an embodiment, the semiconductor pattern 150 may be formed to fill the holes penetrating the gate structure GTS as in an embodiment described with reference to FIGS. 1 through 6.

The word lines WL may be configured to control the electric potential of the semiconductor pattern 150. Accordingly, an electrical connection between the bit line BL and the common source line CSL may be controlled by the word lines WL, the string select line SSL and the ground select line GSL. According to an embodiment, the semiconductor pattern 150 may constitute a unit cell string of a NAND type cell array structure.

According to an embodiment of the inventive concept, the gate structure GTS may be formed by using a fabricating method described in connection with FIGS. 1 through 6 or FIGS. 8 through 14. Referring to FIGS. 21 through 23 and FIGS. 32 and 33, the semiconductor pattern 150 may have sections having a width increasing away from the substrate, and a section having a width decreasing away from the substrate. In an embodiment, the semiconductor pattern 150 may have a pipe shape between the string select line SSL and the ground select line GSL.

Referring to FIGS. 32 and 33, the information storage layer 400 may be formed to continuously cover an outer wall of the semiconductor pattern 150 according to an embodiment. According to an embodiment, the information storage layer 400 may extend horizontally from a portion between a sidewall of the semiconductor pattern 150 and a sidewall of the word line WL to cover a top surface and a bottom surface of the word line WL. For example, the semiconductor pattern 150 and the information storage layer 400 may be formed by applying a method described in connection with FIGS. 1 through 6 or FIGS. 8 through 14, based on a fabricating method of an embodiment described with reference to FIGS. 25 through 31. Referring to FIG. 31, the information storage layer 400 may cover a top surface and a bottom surface of the conductive pattern 450 (i.e., word line WL).

Figure 35:
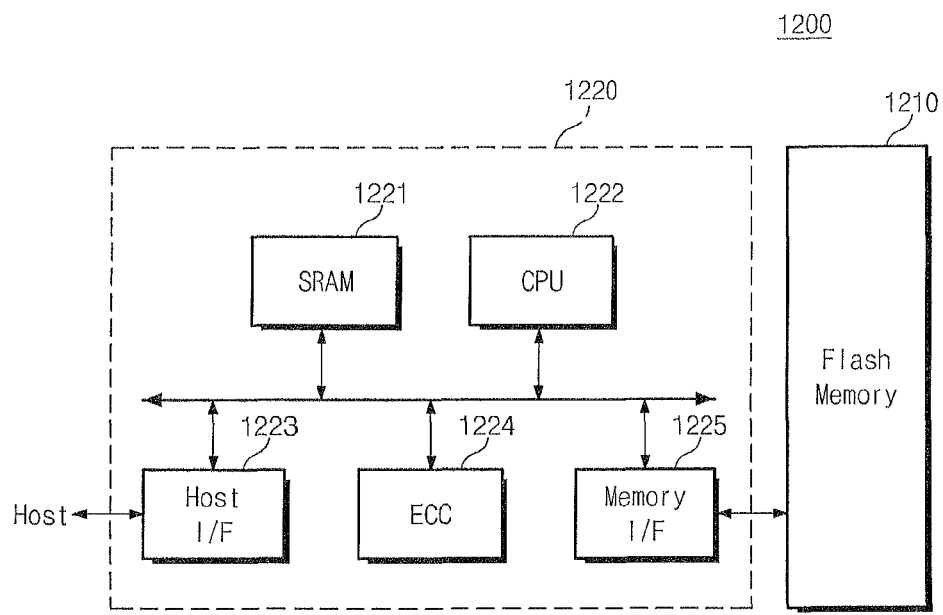
FIG. 35 is a block diagram of a memory card including a flash memory device according to an embodiment of the inventive concept.

FIG. 35 is a block diagram of a memory card 1200 provided with a flash memory device 1210 according to an embodiment of the inventive concept. Referring to FIG. 35, the memory card 1200 for supporting high-capacity data storage capability is provided with the flash memory device 1210 according to an embodiment of the inventive concept. The memory card 1200 may include a memory controller 1220 that controls data exchange between a host and the flash memory device 1210.

An SRAM 1221 is used as a working memory of a central processing unit (CPU) 1222. A host interface 1223 has the data exchange protocol of a host connected to the memory card 1200. An error correction code (ECC) 1224 detects and corrects an error included in data read from the multi-bit flash memory 1210. A memory interface 1225 interfaces with the flash memory device 1210. The CPU 1222 performs an overall control operation for data exchange of the memory controller 1220. The memory card 1200 may further include a ROM storing code data for interfacing with the host.

According to an embodiment of the inventive concept, a memory system with high reliability can be provided by employing the flash memory 1210 as shown in FIG. 35 since erase characteristics of dummy cells are improved. For example, a flash memory device according to embodiments of the inventive concept can be provided in a memory system such as solid state disk SSD. In an embodiment, a read error caused by dummy cells can be prevented to realize a memory system with high reliability.

Figure 36:
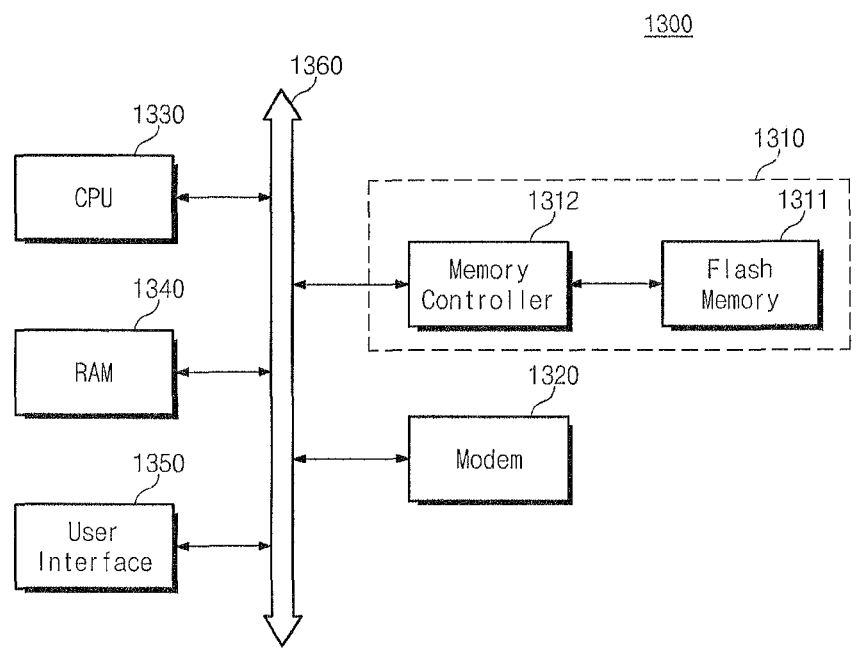
FIG. 36 is a block diagram of an information processing system including a flash memory system according to an embodiment of the inventive concept.

FIG. 36 is a block diagram of an information processing system 1300 provided with a flash memory system 1310 according to embodiments of the inventive concept. Referring to FIG. 36, the flash memory system 1310 is equipped in an information processing system, such as a mobile device and a desktop computer. The information processing system 1300 includes the flash memory system 1310, a modem 1320, a CPU 1330, a RAM 1340, and a user interface 1350 that are electrically connected to a system bus 1360. The flash memory system 1310 may have substantially the same configuration as the flash memory system in FIG. 35. Data processed by the CPU 1330 or external input data is stored in the flash memory system 1310. The flash memory system 1310 may be configured with a semiconductor disk device (SSD). In an embodiment, the information processing system 1300 can stably store high-capacity data in the flash memory system 1310. In an embodiment, since the reliability of the semiconductor device is improved, the flash memory system 1310 can save resources consumed in error correction, thus providing a high-speed data exchange function to the information processing system 1300. In an embodiment, the information processing system 1300 may further include an application chipset, a camera image processor (CIS), and an input/output device.

The flash memory device or the memory system according to an embodiment of the inventive concept may be mounted in various types of packages. Examples of the packages of the flash memory device or the memory system according an embodiment of to the inventive concept include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Multi Chip Package (MCP), Wafer-level Fabricated Package (WFP), and Wafer-level Processed Stack. Package (WSP).

According to embodiments of the inventive concept, semiconductor patterns penetrating stacked conductive patterns and an information storage layer disposed between the conductive patterns and the semiconductor pattern are provided. Each of the semiconductor patterns may include a lower semiconductor pattern and an upper semiconductor pattern, and the lower and upper semiconductor patterns may be formed to fill lower and upper penetrating holes, which are formed by using different process operations. In an embodiment, since the information storage layer can be formed by using one time process operation, two portions of the information storage layer, which are formed around the lower and upper semiconductor patterns, respectively, may be substantially simultaneously formed. Accordingly, non-uniformity in electrical properties between memory cells can be suppressed.

The lower and upper penetrating holes are formed by using different process operations, while the lower and upper semiconductor patterns filling the lower and upper penetrating holes can be formed at one time by using the same process. For example, according to an embodiment of the inventive concept, the lower and upper penetrating holes may be formed sequentially by using sacrificial layers, but the lower and upper semiconductor patterns may be formed to fill the penetrating holes formed by removing the sacrificial layers at one time. Accordingly, since the lower and upper semiconductor patterns are also formed of the same material without a discontinuous boundary surface, non-uniformity in electrical properties between memory cells can be suppressed.

Although the exemplary embodiments of the inventive concept have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A semiconductor memory device, comprising:
    a first multilayer structure disposed on a substrate, the first multilayer structure Comprising a plurality of alternating first insulating layers and first conductive patterns disposed between a first channel member and an isolation member;
    a second multilayer structure disposed on the first multilayer structure, the second multilayer structure comprising a plurality of alternating second insulating layers and second conductive patterns disposed between a second channel member and the isolation member; and
    an information storage layer disposed between each first conductive pattern and the first channel member and disposed between each second conductive pattern and the second channel member,
    wherein the isolation member tapers from a top portion to a bottom portion of the isolation member such that a width of the isolation member gradually decreases.

2. The semiconductor memory device of claim 1, wherein a top portion of the first channel member is larger than a bottom portion of the first channel member.

3. The semiconductor memory device of claim 1, wherein a top portion of the second channel member is larger than a bottom portion of the second channel member.

4. The semiconductor memory device of claim 1, wherein a bottom portion of the second channel member is smaller than a top portion of the first channel member.

5. The semiconductor memory device of claim 1, wherein the top portion of the isolation member is larger than the bottom portion of the isolation member.

6. A three-dimensional semiconductor memory device, comprising:
    a substantially planar substrate;
    a plurality of channel members stacked on top of each other, the channel members disposed through a plurality of conductive patterns and substantially normal to the substrate;
    a plurality of isolation members stacked on top of each other, the isolation members disposed through the plurality of conductive patterns and substantially normal. to the substrate; and
    an information storage layer disposed between the channel members and the conductive patterns thereby forming an elongated memory string comprising a plurality of storage cells, wherein the isolation member comprises a tapering shape having a gradually decreasing width.

7. The memory device of claim 6, wherein a number of stacked channel members is greater than a number of stacked isolation members.

8. The memory device of claim 6, wherein the plurality of channel members comprise semiconductor patterns.

9. The memory device of claim 6, wherein the isolation members comprise insulating patterns.

10. The memory device of claim 6, wherein the information storage layer comprises an oxide-nitride-oxide (ONO) layer.

11. A semiconductor memory device, comprising:
    a first multilayer structure comprising a plurality of alternating first insulating layers and first conductive patterns on a substrate;
    a first semiconductor pattern substantially normal to the substrate disposed in the first multilayer structure;
    a second multilayer structure comprising a plurality of alternating second insulating layers and second conductive patterns disposed on the first multilayer structure;
    a second semiconductor pattern disposed in the second multilayer structure, the second semiconductor pattern substantially normal to the substrate and aligned with the first semiconductor pattern;
    an information storage layer disposed between each first conductive pattern and the first semiconductor pattern and between each second conductive pattern and the second semiconductor pattern thereby forming an elongated memory string comprising a plurality of storage cells; and
    an isolation trench formed in the first and second multilayer structures, the trench substantially normal to the substrate and substantially parallel with the first and second semiconductor patterns.

12. The memory device of claim 11, wherein the information storage layer comprises a seamless layer at a boundary between the first multilayer structure and the second multilayer structure.

13. The memory device of claim 11, further comprising a connection pad disposed between the first semiconductor pattern and the second semiconductor pattern.

* * * * *